(12) United States Patent
Lenz et al.

(10) Patent No.: US 6,671,330 B1
(45) Date of Patent: Dec. 30, 2003

(54) POWER AMPLIFIER

(75) Inventors: Helmut Lenz, Oberasbach (DE); Christian Schwingenschloegl, Schwaig (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 09/460,120

(22) Filed: Dec. 13, 1999

(30) Foreign Application Priority Data

Dec. 14, 1998 (DE) .......................................... 198 57 525

(51) Int. Cl.[7] .......................... H04K 1/02; H04L 25/03; H04L 25/49
(52) U.S. Cl. .......................................... 375/297; 375/238
(58) Field of Search ................................. 375/297, 238; 330/146, 251, 10, 207 A, 175, 176; 332/109, 110, 111

(56) References Cited

U.S. PATENT DOCUMENTS

| 4,673,887 A | | 6/1987 | Atherton |
| 4,773,096 A | * | 9/1988 | Kirn ............................ 381/120 |
| 5,546,299 A | | 8/1996 | Lenz |
| 5,559,467 A | * | 9/1996 | Smedley ....................... 330/10 |
| 5,712,636 A | * | 1/1998 | Buch .......................... 341/152 |
| 5,973,527 A | | 10/1999 | Schweighofer et al. |
| 5,991,179 A | | 11/1999 | Schweighofer |
| 6,038,265 A | * | 3/2000 | Pan et al. .................... 375/316 |
| 6,118,337 A | * | 9/2000 | Schweighofer ............... 330/10 |
| 6,124,757 A | * | 9/2000 | Newey ......................... 330/10 |

FOREIGN PATENT DOCUMENTS

| DE | OS 38 03 583 | 8/1989 |
| DE | OS 38 22 990 | 1/1990 |
| DE | OS 39 24 652 | 1/1991 |
| DE | OS 196 19 208 | 11/1997 |
| WO | WO 98/20608 | 5/1998 |

* cited by examiner

Primary Examiner—Phoung Phu
(74) Attorney, Agent, or Firm—Schiff Hardin & Waite

(57) ABSTRACT

A power amplifier, particularly a gradient amplifier of a nuclear magnetic resonance tomography apparatus, has at least one switched output stage containing a power bridge circuit formed by a number of switch elements, the bridge circuit being connected to a floating intermediate circuit voltage, as well as at least one digital pulse width modulator that generates pulse-width-modulated control signals for all switch elements of the power bridge circuit from digital input signals in order to generate at least one output stage voltage according to an output stage switching clock. The digital pulse width modulator has a modulator base element that contains a counter with an output for a counter reading, at least one comparator with an input for receiving the counter reading, a further input for receiving one of the digital input signals, an output binary signal representing a "smaller-than" comparison, and a further output for a further binary signal representing a "greater-than" comparison of the counter reading to the digital input signal. Circuitry follows the comparator for generating the control signals from the binary signals.

19 Claims, 21 Drawing Sheets

UPPER FREE RUNNING CIRCUIT

LOWER FREE RUNNING CIRCUIT

POWER AMPLIFIER

BACKGROUND OF THE INVENTION

1. Field of the Invention

The present invention is directed to a power amplifier of the type having at least one switched output stage with a power bridge circuit formed by switch elements connected to a floating intermediate circuit voltage, as well as with at least one digital pulse width modulator that generates pulse-width-modulated control signals for all of the switch elements of the power bridge circuit from digital input signals in order to generate an output stage voltage according to an output stage switch clock.

2. Description of the Prior Art

In power amplifiers of this type, high powers must be regulated with extreme accuracy. This is particularly the case for gradient amplifiers in a magnetic resonance tomography apparatus. The same is true, for example, in inductive heating devices in x-ray units or for the drive control of electric motors.

In a gradient amplifier, an alternating current on the order of magnitude of ±300 V given a current on the order of magnitude of 300 A is generated with a power bridge circuit. The power amplifier must exhibit such high precision that the current flow for each of the three gradient coils can be set in the mA range. The turn-on phases of the individual switch elements in the power bridge circuit, which are essentially defined by the output stage switch clock or clocks, must therefore be capable of being essentially continuously varied as to their respective time duration. For this reason, pulse width modulators of gradient amplifiers have conventionally been implemented in purely analog fashion, in order to allow the switching times of the switch elements, which, for example, can be power transistors, to be controlled as finely as desired.

Particularly power amplifiers having a number of switched output stages require a high component outlay due to the corresponding number of analog pulse-width modulators and also require correspondingly complicated electrical connections since, in this case, a number of phase-shifted delta-shaped voltages are required. The required, high number of components in the known power amplifiers leads to a correspondingly large structural volume as well as to correspondingly high manufacturing costs.

German Patent 197 09 767 discloses a method for operating a power amplifier of the above-described type with a number of switched output stages wherein the pulse-width-modulated control signals are cyclically exchanged between the switched output units. As a result, a good distribution of energy that, for example, is fed back to a load, is achieved among all switched output stages without requiring special discharge or energy distribution means between the switched output stages.

A power amplifier of the type initially described is disclosed, for example, in U.S. Pat. No. 4,673,887. A digital pulse width modulator has, as the basic components for generating pulse-width-modulated control signals, a clock generator, a clock divider as well as at least one shift register. The clock divider generates an on/off pulse sequence from a clock signal of the clock generator, this on/off pulse sequence being supplied to the shift register. The shift register is fashioned such that a phase relation of the on/off pulse sequence can be shifted. The pulse-width-modulated control signals are ultimately formed from a logic operation of the phase-shifted on/off pulse sequence with the non-phase-shifted on/off pulse sequence.

German OS 196 19 208 discloses a further power amplifier having a digital pulse width modulator. This pulse width modulator contains a digital sigma-delta modulator that converts an arbitrary, band-limited input signal into an output signal that is a pulse-width-modulated representation of the input signal.

German OS 38 03 583 discloses a further power amplifier having a digital pulse width modulator. This modulator contains a so-called fine stage that includes a counter as well as a port. The counter is thereby capable of being set to a prescribable reference value. The port is opened upon the setting of this reference value and the counter counts from the reference value down to zero. When zero is reached, the port closes. A pulse-width-modulated control signal is ultimately generated by the opening and closing of the port. Among the disadvantages of this known power amplifier is that the modulator does not react immediately to a change in reference value while the counter is counting down, but takes this into consideration no earlier than after the end of the count-down.

PCT Application WO 98/20608 discloses a further power amplifier having a digital pulse width modulator. The central components of the this modulator are a data memory, an upward counter as well as downward counter. During a prescribable period duration, the upward counter counts dependent on a clock frequency from a start value up to a maximum value that it retains until the end of the period duration or the upward counter assumes the start value after it has reached the maximum value, and stays at the re-assumed start value until the end of the period duration. The downward counter behaves correspondingly inverse thereto. The current values of both counters are compared with a value, for example a reference value, prescribable in the data memory. Given equality, signals are generated that ultimately determine a pulse-width modulated control signal. Given a change in the reference value within a period duration, there is the risk that the modulator will get out of step. For a defined operation of the modulator, the reference value thus can be modified only from period duration to period duration. This offers a dynamic behavior which is insufficient for many applications.

SUMMARY OF THE INVENTION

It is an object of the present invention is to provide a power amplifier of the type initially described wherein the aforementioned disadvantages of the prior art are alleviated.

This object is inventively achieved in a power amplifier having at least one switched output stage with a power bridge circuit formed by a number of switch elements that is connected to a floating intermediate circuit voltage, and also has at least one pulse width modulator that generates pulse-width-modulated control signals for all of the switch elements of the power bridge circuit from input signals in order to generate at least one output stage voltage according to an output stage switch clock. The pulse width modulator is fashioned as a digital pulse width modulator to which digital input signals can be supplied and whose pulse-width-modulated control signals are based on the control signals of an analog pulse width modulator, so that the generated output stage voltages closely approximate analog curve.

In the inventive power amplifier, thus, the switch behavior of the digital pulse width modulator simulates the switch behavior of an analog pulse width modulator. The generated output stage voltages thus approximate an analog curve, i.e.

exhibit an analog curve or a nearly analog curve. The inventive power amplifier thus delivers exact output stage switch clocks, so that the current flux generated in an inductive load that is across at the outputs of the power amplifier exhibits high precision. The inventive power amplifier is thus ideally employable for operating gradient coils of a magnetic resonance tomography apparatus.

The digital pulse width modulator utilized in the inventive power amplifier has a significantly smaller structural size compared to an analog pulse width modulator. The inventive power amplifier according to claim 1 thus requires less installation space.

In a preferred embodiment of the invention, at least two switched output stages are series-connected at the output side so that the power amplifier has an output voltage that corresponds to the sum of these output stage voltages. In a further version, all switched output stages can be driven with switch signals that are offset relative to one another. As a result of this measure, the maximum output voltage as well as the effective switching frequency are multiplied by a factor that generally corresponds to the number of switched output stages.

By employing a number of switched output stages, the cost/power relationship is further improved, since, in addition to the economic, digital pulse width modulators, the individual switched output stages from which the power amplifier is constructed need not satisfy any particularly high demands and are thus more economic than a single, high-performance switched output stage. The advantages of inexpensive power transistors, which might otherwise be unsuited because they have a slow switching behavior, (for example, IGBTs, insulated gate bipolartransistors) can also be exploited. Moreover, due to the low switching frequency of the individual switched output stages, significantly lower losses occur.

In preferred embodiments, an odd numbered plurality of switched output stages is used. The phase angle of the output stage switch clock signals preferably is to 360°/k, wherein k is the number of switched output stages.

A uniform division of the overall load among the individual switched output stages preferably ensues. The switched output stages can, in particular, contribute to the output voltage of the power amplifier in equal parts and/or in a symmetrical fashion. For example, the switched output stages can be driven such that they supply voltage pulses of identical width.

Given an output voltage of 2000 V, a voltage boost of 400 V is obtained given, for example, five identical switched output stages, and thus a lower ripple is obtained at the output of the power amplifier despite a maximum output power of 2000 V.

In a preferred embodiment of the inventive power amplifier, two voltage pulses are generated in each switched output stage in each cycle of the output stage switch clock, each of these being separated by a free-running mode. The two voltage pulses can be produced by a diagonal operation of the power bridge circuit, and the two free-running modes can each correspond to a condition of the power bridge circuit wherein a load current can flow unimpeded through the power bridge circuit.

DESCRIPTION OF THE DRAWINGS

FIG. 18 shows the curve of a non-digitized signal IN.

FIG. 19 a smoothing circuit for the non-digitized signal IN.

DESCRIPTION OF THE PREFERRED EMBODIMENTS

Figure 1:
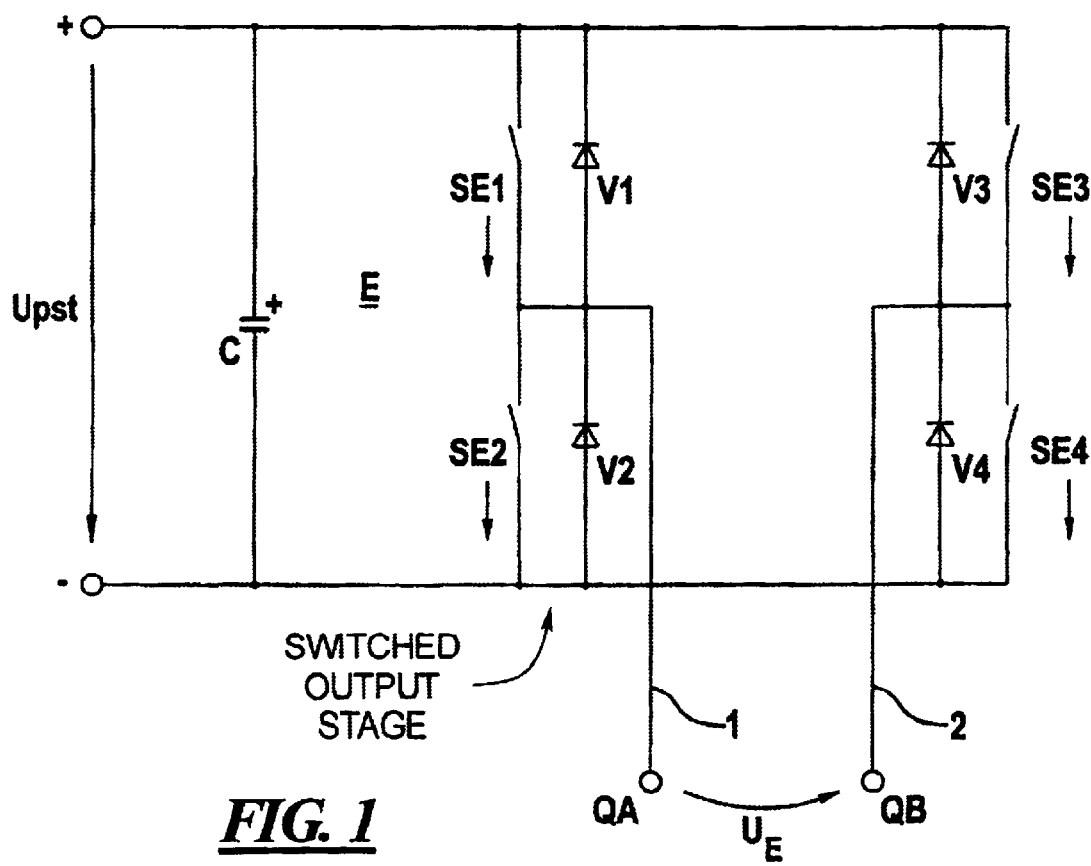
FIG. 1 is a circuit diagram of a switched output stage in accordance with the invention.
Figure 5:
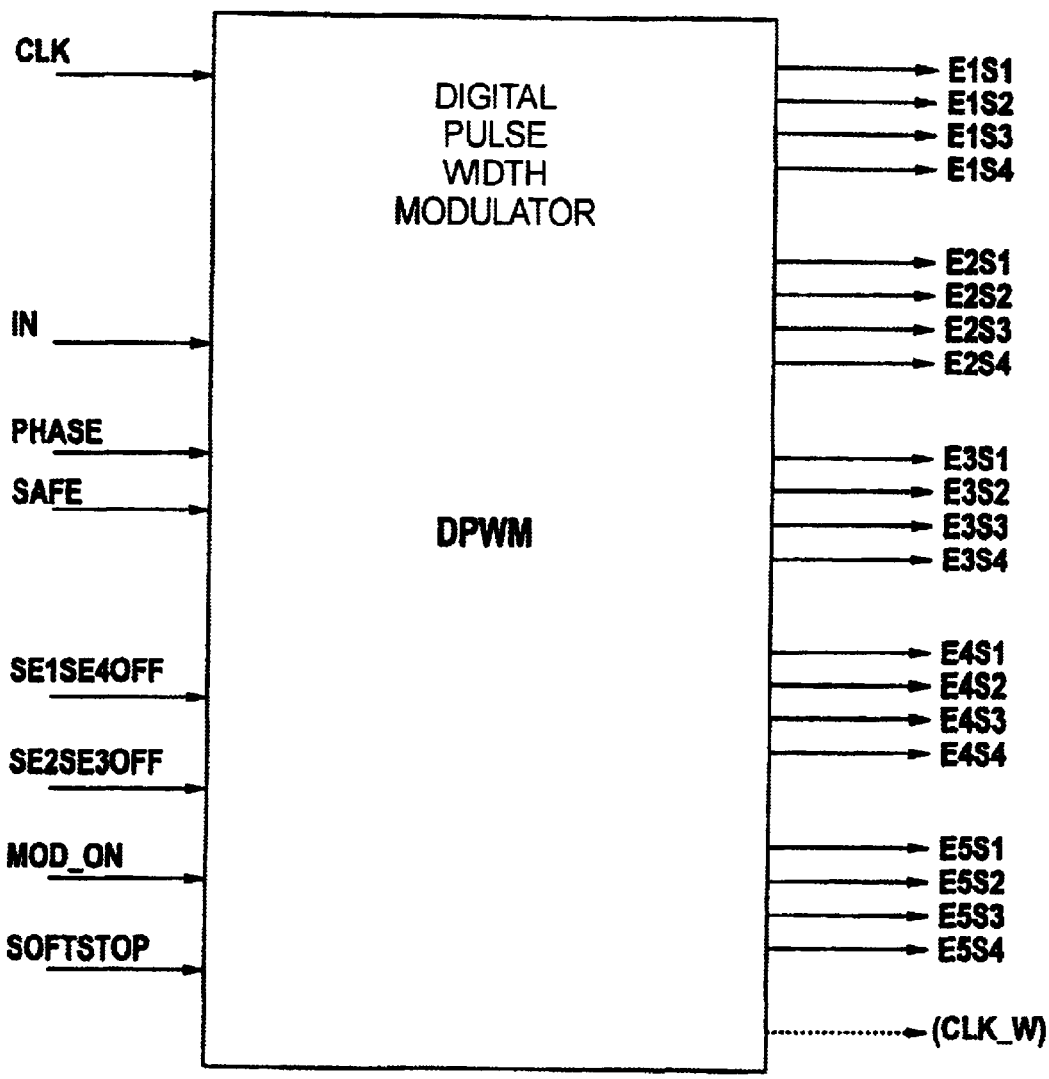
FIG. 5 is a schematic illustration of a digital pulse width modulator that is suitable for an inventive power amplifier.

The switched output stage E shown in FIG. 1 has a power bridge circuit that is connected to a floating supply voltage Upst. The power bridge circuit has four switch elements SE1 through SE4 arranged in respective arms of an H-bridge that respond to pulse-width-modulated control signal of a digital pulse width modulator DPWM (FIG. 5). The switch elements SE1 through SE4 are, for example, implemented as MOS-FET transistors or as bipolar transistors with unbiased diodes. Respective pairs of the switch elements SE1 and SE3, and SE2 and SE4, are connected to the positive and negative terminals of a supply voltage Upst. The remaining terminals of the respective pairs of switch elements (SE1 and SE2 or SE3 and SE4) are connected in pairs to one another and to respective connecting lines 1 and 2. The connecting line 1 leads to the output QA of the switched output stage E, and the connecting line 2 leads to the output QB of the switched output stage E. Respective unbiased diodes V1 through V4 are connected in parallel with the switch elements SE1 through SE4, with opposite polarity. A capacitor C buffers the floating supply voltage Upst, resulting in an intermediate circuit voltage across the power bridge circuit.

The outputs QA and QB of the switched output stage E are connected to a primarily inductive load L, for example to a gradient coil (see FIGS. 2a through 2d and FIGS. 3a through 3d).

For building up the current and holding the current, the switch elements SE1 through SE4 of the switched output stage E according to FIG. 1 assume the switch statuses shown in FIGS. 2a through 2d. The current flux, which always flows from the output QA across the inductive load L to the output QB of the switched output stage E, is shown with broken lines in FIGS. 2a through 2d.

Figure 2A:
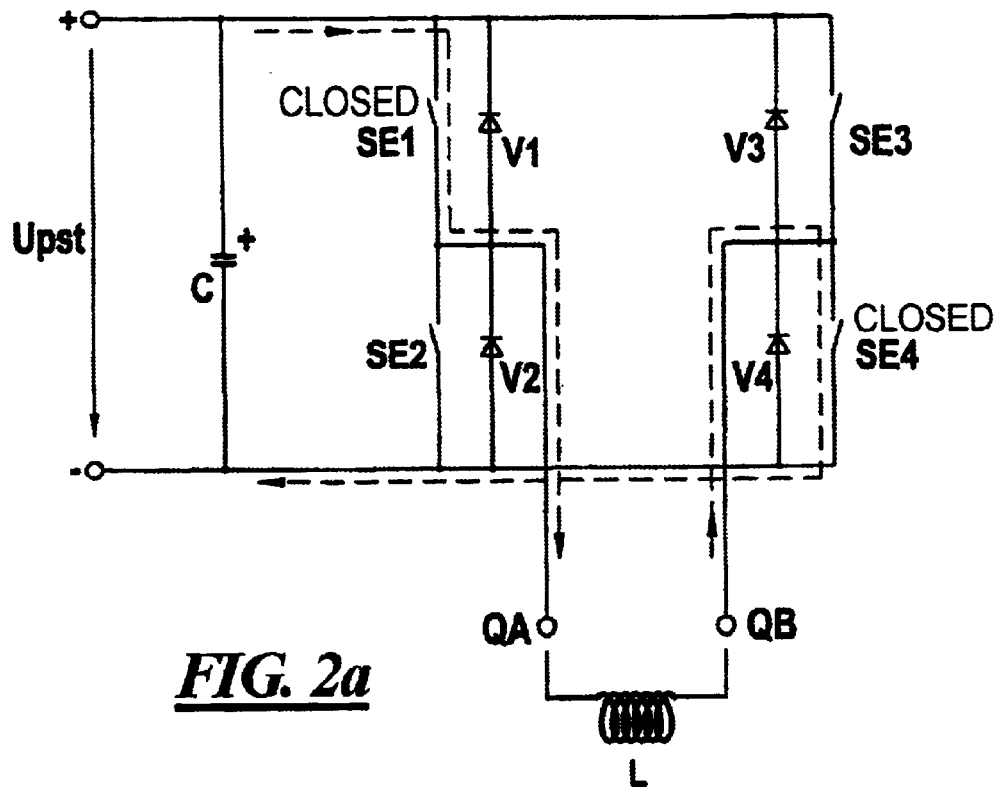
FIGS. 2a–2e show the various switch statuses of the switched output stage according to FIG. 1 given current built-up and when holding current.

When the switch elements SE1 and SE4 are closed as in FIG. 2a, the current flows from the positive supply voltage side through the switch element SE1 into the inductive load L and through the switch element SE4 to the negative terminal of the supply voltage Upst. Energy is taken from the intermediate circuit (capacitor C). The output QA of the switched output stage E is positive compared to the output QB of the switched output stage E. The switched output stage E is thus in the "first diagonal mode".

Figure 2B:
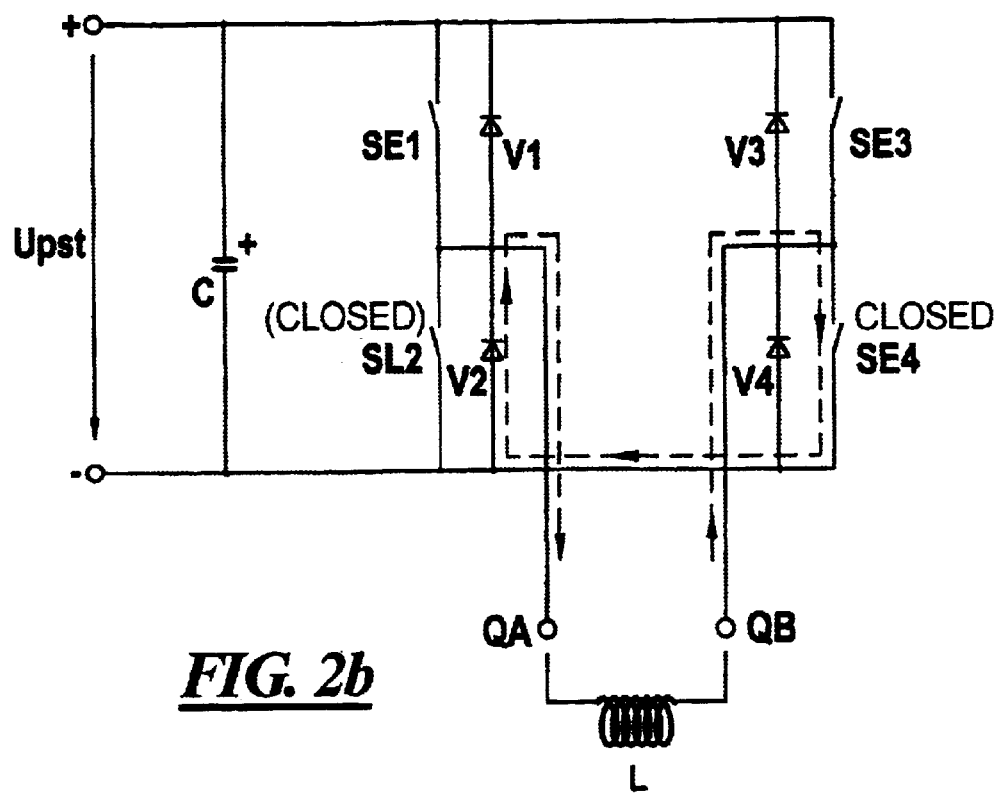

Given the switch status according to FIG. 2b, the switch element SE4 is closed, and the switch element SE2 can be switched on or off. The current flows in the switched output stage E from the output QB through the switch element SE4 and the diode V2 to the output QA of the switched output stage E. When the switch element SE2 is a MOSFET and is conducting, the switch element SE2 can accept a part of the diode current of the diode V2. The output QB of the switched output stage E is then minimally positive compared to the output QA. The switch status of the switched output stage E shown in FIG. 2b is referred to as "lower free-running mode".

Figure 2C:
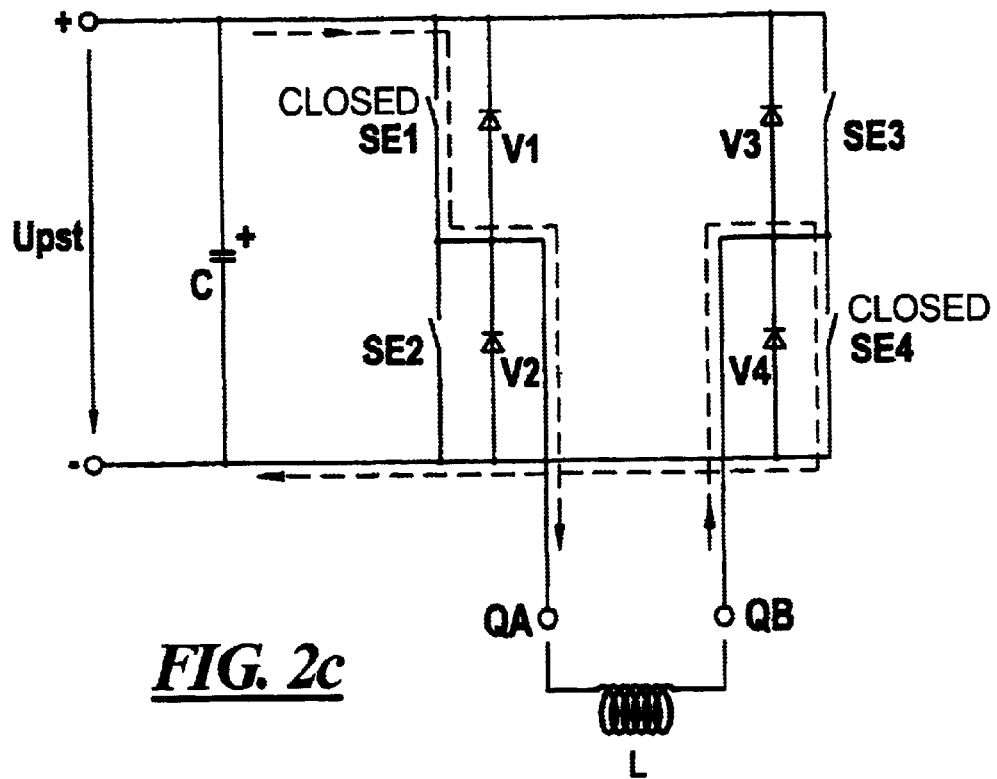

The status of the switch elements SE1 through SE4 shown in FIG. 2c corresponds to the status of the switch elements SE1 through SE4 in FIG. 2a and is therefore again referred to as "first diagonal mode".

Figure 2D:
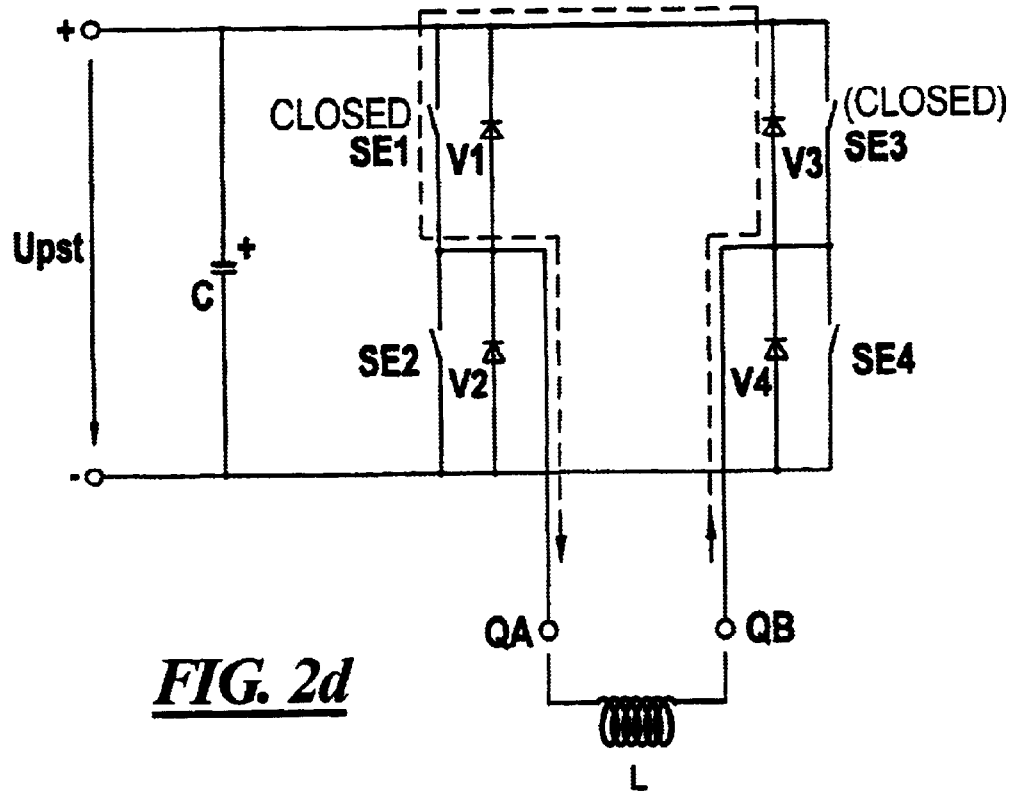

Given the status of the switch elements SE1 through SE4 shown in FIG. 2d, the switch element SE1 is conducting, the switch element SE3 can be conducting but need not be, and the switch elements SE2 and SE4 are open. The current flows in the switched output stage E from the output QB through the diode V3 and the switch element SE1 to the output QA of the switched output stage E. When the switch element SE3 is a MOSFET, the switch element SE2 can assume a part of the diode current of the diode V3. The switch status shown in FIG. 2 is referred to as "upper free-running mode".

Figure 2E:
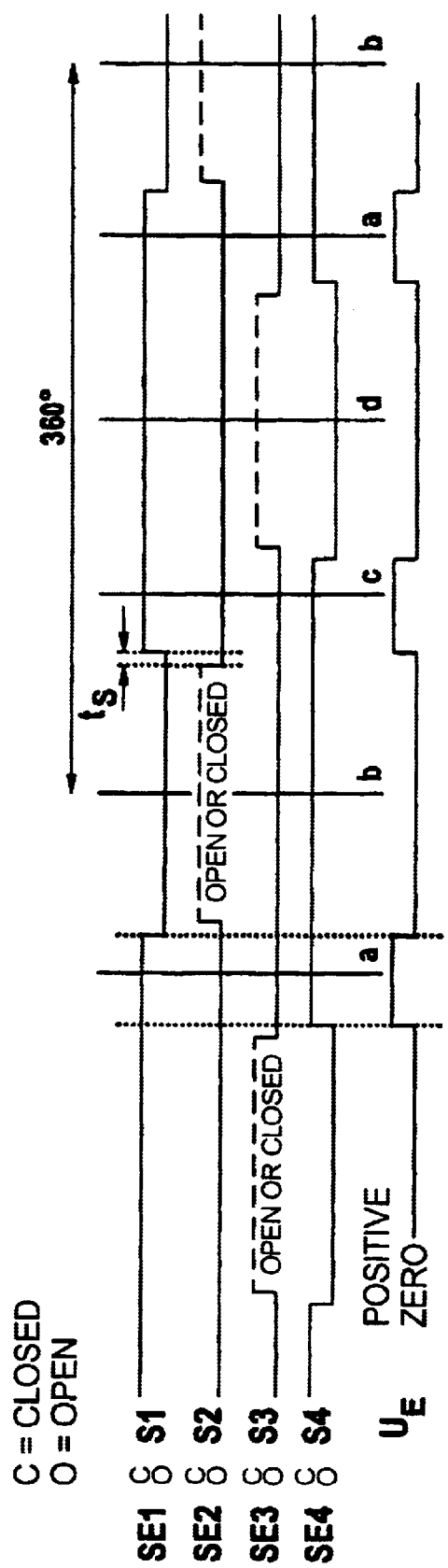

In FIG. 2e, the pulse-width-modulated control signals S1 through S4, with which the digital pulse width modulator DPWM drives the switch elements SE1 through SE4 are shown for the operating conditions of the switched output stage E shown in FIGS. 2a through 2d. The output stage voltage $U_E$ (voltage between the outputs QA and QB of the switched output stage E) is shown at the bottom in FIG. 2e. The brief time offset in the drives of the switch elements SE1 through SE4 represents a safe time $t_s$ since the switch elements SE1 and SE2, or SE3 and SE4, must never be simultaneously activated. The operating instances shown in FIGS. 2a through 2d are referenced with the letters a through d.

FIGS. 3a through 3d show the switch statuses of the switched output stage E illustrated in FIG. 1 given current dismantling in the inductive load L (gradient coil) due to counter-voltage. Energy is thereby returned from the gradient coil L into the intermediate circuit (capacitor C). The current flux is again shown with broken lines.

Figure 3A:
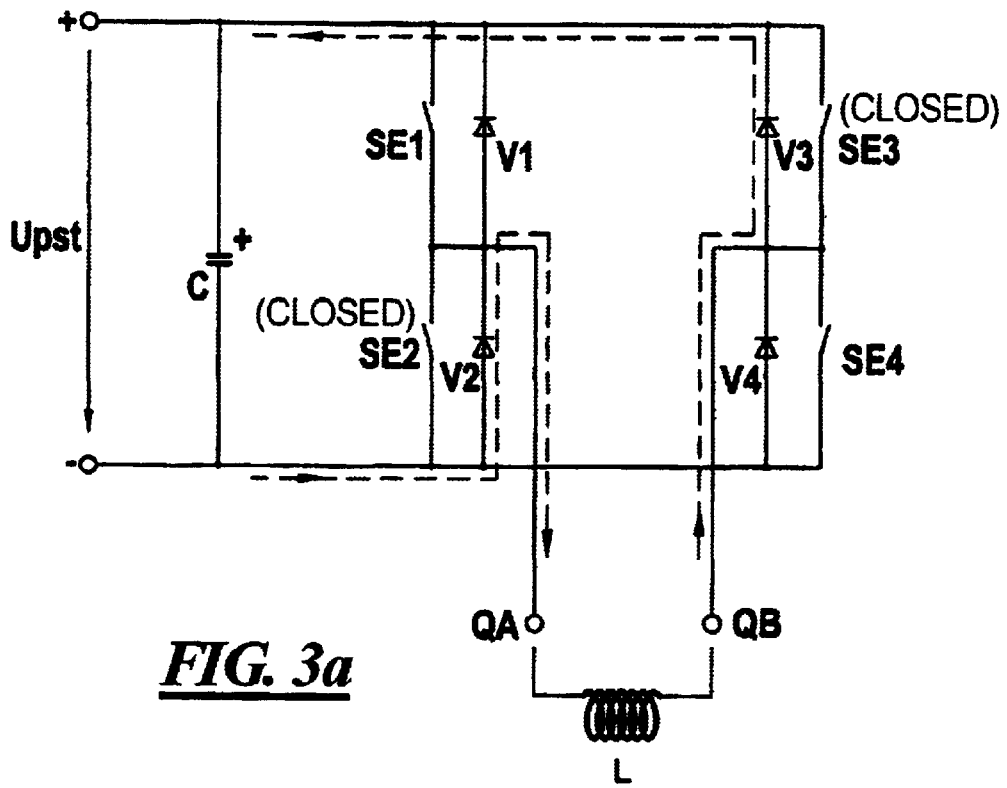
FIGS. 3a–3e show the various switch statuses of the switched output stage according to FIG. 1 given current dismantling.

The current flux shown in FIG. 3a is obtained when the switch elements SE1 and SE4 are open. The switch elements SE2 and SE3 can but need not be closed. The current flows from the negative supply voltage side through the diode V2 into the inductive load L and from the output QB of the switched output stage E through the diode V3 to the positive terminal of the supply voltage Upst. Energy is thus supplied back into the intermediate circuit (capacitor C). The output QB of the switched output stage E is positive compared to the output QA of the switched output stage E.

Figure 3B:
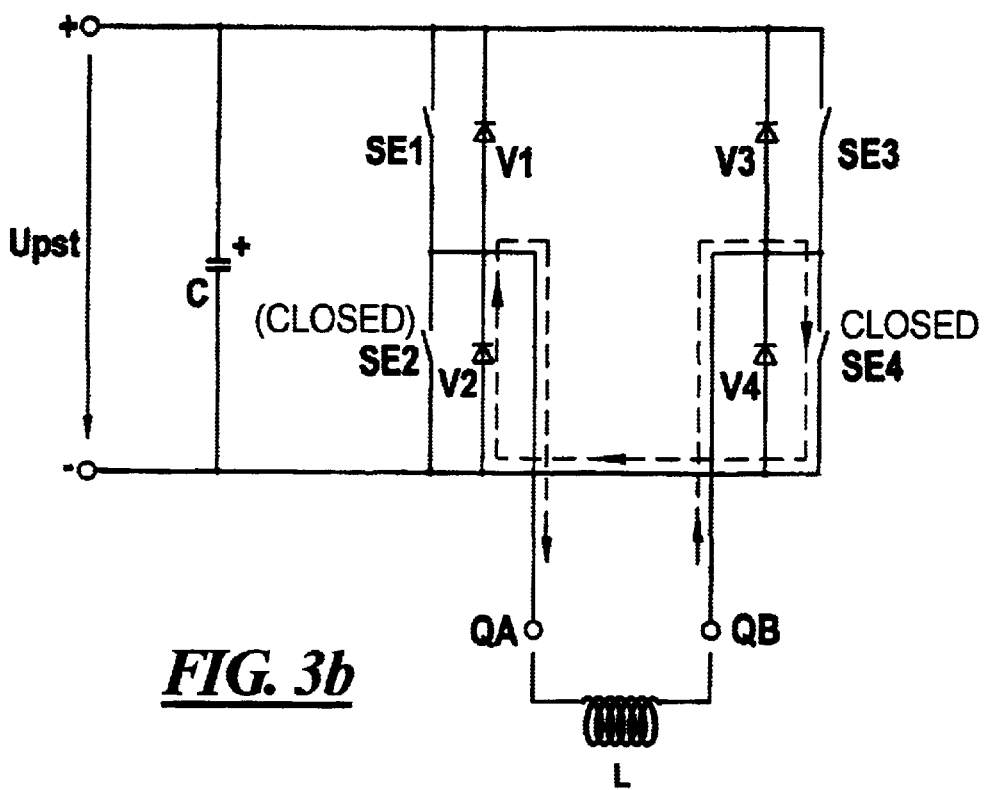

In FIG. 3b, the switch element SE4 is closed and thus the switch element SE2 can but need not be activated. The switch elements SE1 and SE3 are open. The current thus flows from the output QB of the switched output stage E through the switch element SE4 and the diode V2 to the output QA of the switched output stage E (lower free-running mode).

Figure 3C:
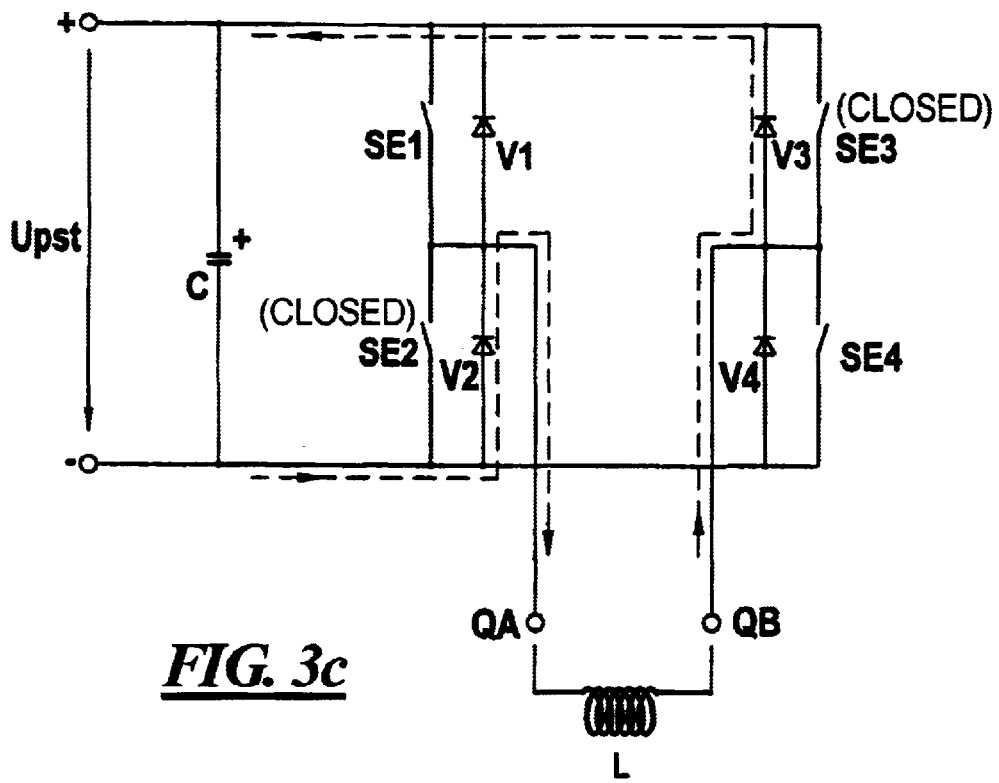

The switch status of the switched output stage E shown in FIG. 3c corresponds to the switch status shown in FIG. 3a.

Figure 3D:
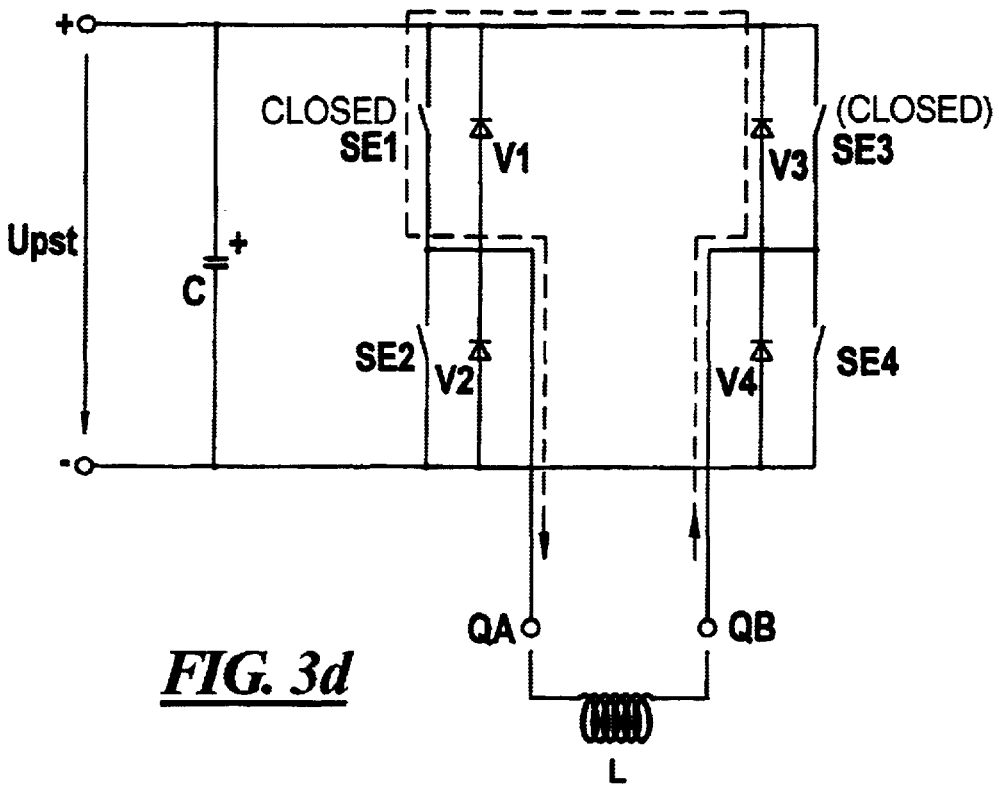

The current flux shown in FIG. 3d is achieved by the switch element SE1 being closed and the switch elements SE2 and SE4 being open. The switch element SE3 can but need not be closed. The current thus flows back from the output QB of the switched output stage E through the diode V3 and the switch element SE1 to the output QA of the switched output stage E (upper free-running mode).

Figure 3E:
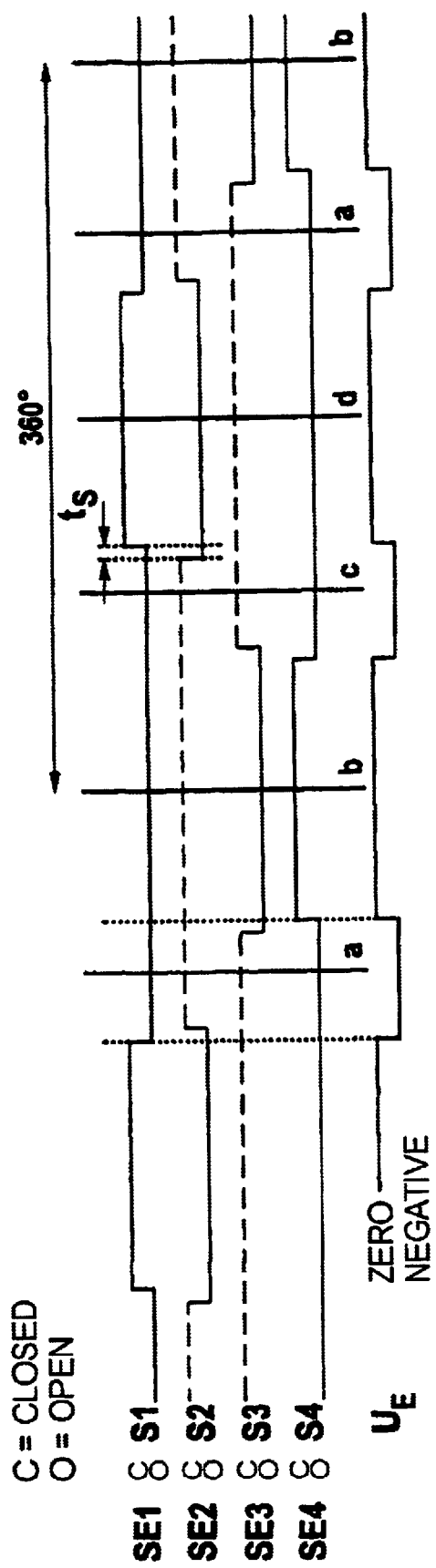

The switch statuses of the switch elements SE1 through SE4 shown in FIGS. 3a through 3b are achieved by the pulse-width-modulated control signals S1 through S4 shown in FIG. 3e, whereby the output stage voltage $U_E$ (voltage between the outputs QA and QB of the switched output stage E) shown at the bottom in FIG. 3e arises. The on durations of the switch elements SE1 and SE4 are shorter here than the on durations shown in FIG. 2e. In this example, the input signals of the digital pulse width modulator DPWM from which the pulse-width-modulated control signals S1 through S4 for all switch elements SE1 through SE4 of the power bridge circuit are generated, thus would be smaller.

The switch statuses given the opposite current direction are not shown; they correspond analogously to FIGS. 2 and 3, whereby the switch element SE1 is assumed to be interchanged with the switch element SE3 and the switch element SE2 is assumed to be interchanged with the switch element SE4.

The modulation shown in FIGS. 2a through 2e as well as 3a through 3e is significantly more advantageous compared to a known, simpler modulation that is not shown. Given this known, simpler modulation, the switch elements SE1 and SE4 and subsequently, the switch elements SE2 and SE3 are activated in sequence. Due to the lack of the upper free-running mode and of the lower free-running mode in such conventional operation, the full output stage voltage $U_E$ (output voltage of the switched output stage E) is always across the inductive-load L, leading to an extremely high current ripple.

Figure 4:
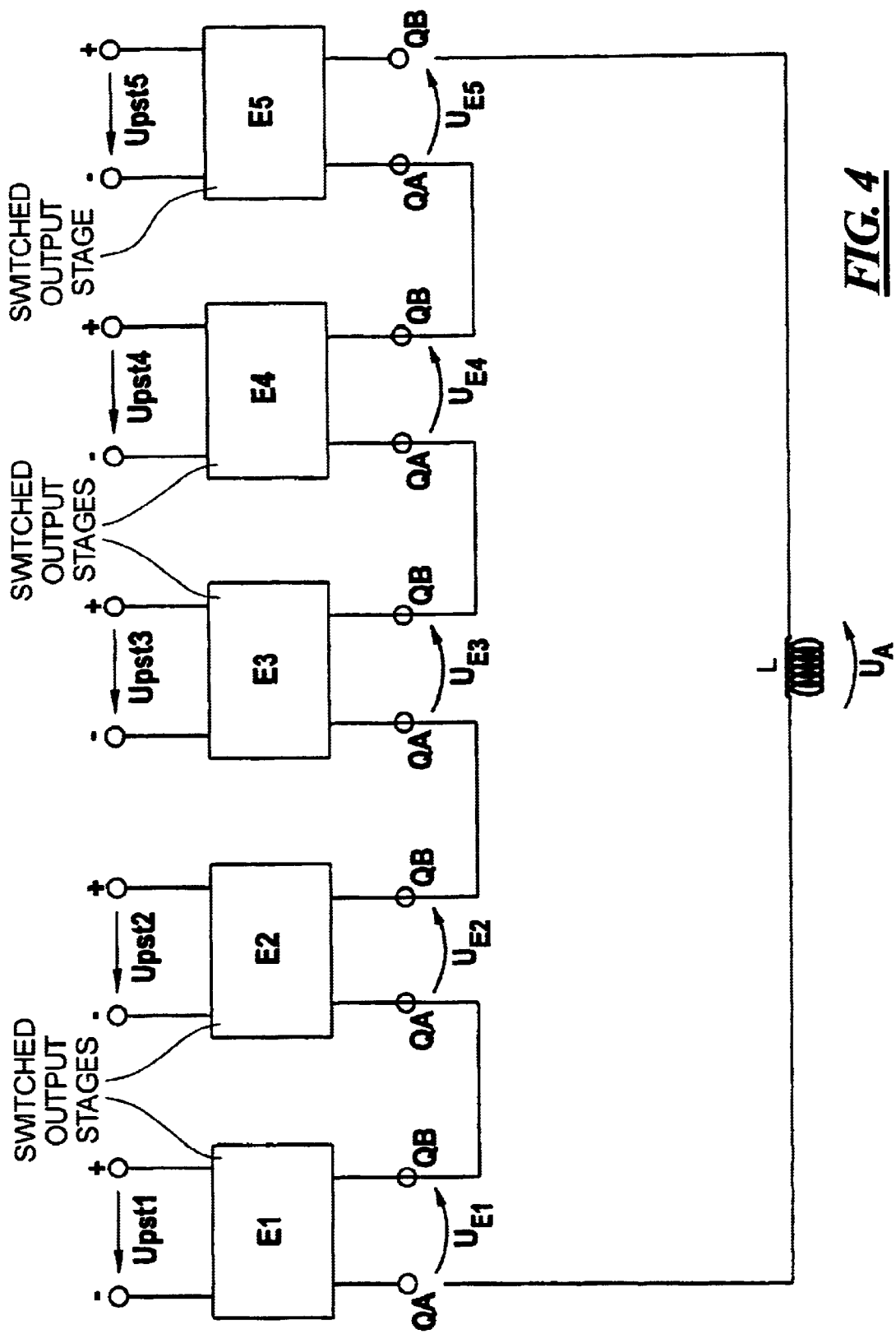
FIG. 4 is a schematic circuit diagram of a power amplifier having five switched output stages in accordance with the invention.

FIG. 4 shows a series circuit (cascading) of (in this exemplary embodiment) five switched output stages E1 through E5. The switched output stages E1 through E5 are supplied respectively by floating supply voltages Upst1 through Upst5. The five switched output stages E1 through E5 are identically constructed and correspond to the switched output stage E described in FIG. 1. The pulse-width-modulated control signals S1 through S4 for the switched output stages E1 through E5 (output signals of the digital pulse-width modulator DPWM) correspond to the pulse-width-modulated control signals S1 through S4 from FIGS. 2e and 3e. The pulse-width-modulated control signals S1 through S4 for each switched output stage E1 through E5 are respectively shifted by 360°/5=72° relative to one another given a switching cycle of 360°. The output voltage $U_A$ of the power amplifier is thus the sum of the output stage voltages $U_{E1}$ through $U_{E5}$.

The embodiment of the inventive digital pulse width modulator DPWM shown schematically in FIG. 5 generates the respective pulse width modulated control signals S1 through S4 required for the switch elements SE1 through SE4 from an input signal IN for producing five switched output signals E1 through E5. As an example reference E3S2 denotes that the pulse-width-modulated control signal S2 for the switch element SE2 in the switched output stage E3 is present at this output of the digital pulse width modulator DPWM. The reference E1 S4, for example, denotes the analogous case that the switch element SE4 of the switched output stage E1 is driven via this output with its pulse-width-modulated control signal S4.

For determining the input signal IN, the digital pulse width modulator DPWM generates the A/D converter clock CLK-W.

The input signal IN satisfies the condition that the pulse width for a lower limit value in its value range amounts to zero percent of a switching period duration, by contrast whereto the pulse width amounts to 100% given an upper limit value of its value range. The input signal IN can be a digital word, for example from a digital regulator, or an analog regulator or control signal that is converted into a digital value via an analog-to-digital converter.

The input signal IN is several bits wide and determines the pulse-width-modulated control signals Si through S4 of the digital pulse width modulator DPWM.

Given the digital pulse width modulator DPWM shown in FIG. 5, it is taken into consideration as an option that the switch elements SE1 through SE4 that are respectively not needed for the current conduction with a given current direction, are not activated, i.e. remain open. Given the current directions defined in FIGS. 2a through 2d as well as 3a through 3d, these are always the switch elements SE2 and SE3. This is taken into consideration by the two shutoff signals SE1SE4OFF and SE2SE3OFF that can be supplied to the digital pulse width modulator at the input side. When, thus, the shut off signal SE1SE4OFF is supplied to the digital pulse width modulator DPWM, then the switch elements SE1 and SE4 are blocked in their open position, by contrast to which the two switch elements SE2 and SE3 remain in the open condition when the shut off signal SE2SE3OFF is present. The shut off signals SE1SE4OFF and SE2SE3OFF are HIGH signals in the exemplary embodiment.

The phase offset desired given the series circuit of five switched output stages E1 through E5 shown in FIG. 4 is taken into consideration by the phase signal PHASE in the digital pulse width modulator DPWM according to FIG. 5.

The signal SAFE determines the duration of the safe time $t_s$. The signal MOD_ON enables the outputs of the digital pulse width modulator DPWM. The shut off signal SOFT-STOP effects a shut off of the output stage voltages $U_{E1}$ through $U_{E5}$ by driving a free-running circuit, and thus a soft shut off of the output voltage $U_A$ of the power amplifier. As a result, nerve stimulation of the patient due to an excessively large change in magnetic field is reliably prevented.

If the safe time $t_s$ shown in FIGS. 2e and 3e is left out of consideration, then the drive of the switch element SE2 is inverse to the drive of the switch element SE1, and the drive of the switch element SE4 is inverse to the drive of the switch element SE3. The on duration of the switch element SE3 decreases to the same extent as, given an increasing input signal, the on duration of the switch element SE1 increases. The behavior of the switch element SE3 thus corresponds to the switch behavior of the switch element SE1 with a reversed (inverted) input signal. For a simple modulator base element, it is thus adequate to generate the pulse width modulation of the switch element SE1.

Figure 6:
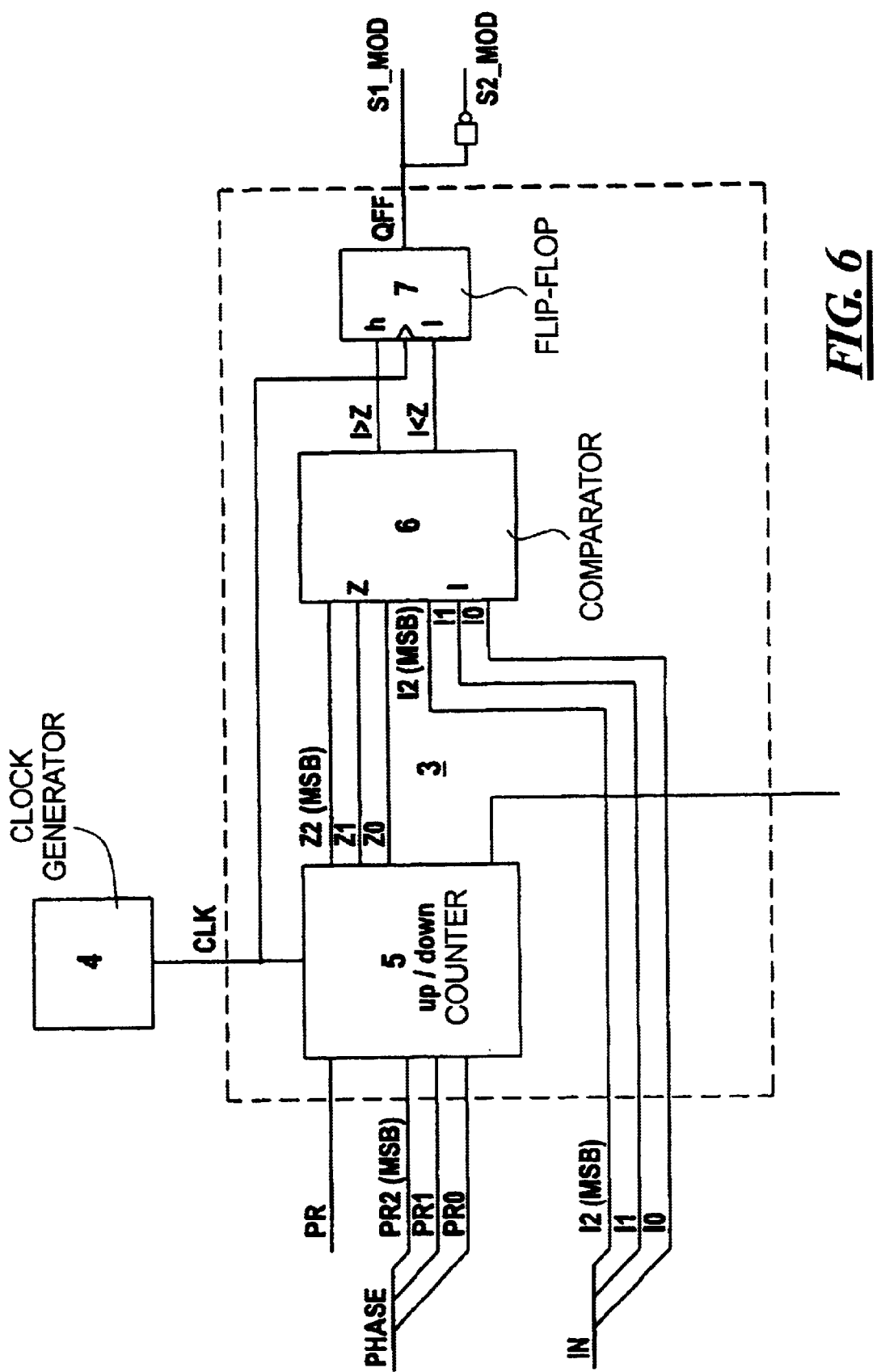
FIG. 6 shows a modulator basic element of an inventive pulse width modulator.

FIG. 6 shows a simple modulator base element 3 having a width of 3 bits. It is supplied with a clock signal CLK by a clock generator 4 and is composed of a 3-bit counter 5 that automatically counts up and down, i.e. from "000" to "111" and from "111" back to "000". The input signal IN likewise has a width of 3 bits. The input signal IN, which can assume the values I0, I1, I2, and the counter reading Z, that can assume the values Z0, Z1, Z2, are supplied to a comparator 6 and are compared to one another therein. The comparator 6 has two outputs I>Z and I<Z. When the input signal IN is greater than the counter reading Z, then the output I>Z is set to "HIGH"; when the input signal IN is smaller than the counter reading Z, then I<Z is set to "HIGH". The two comparator signals I>Z and I<Z are supplied to a flip-flop 7 whose output OFF given a positive signal edge of the clock signal CLK - is set to "HIGH" by the comparator signal I>Z and i set to "LOW" by the comparator signal I<Z. A LOW level at the two inputs of the flip-flop 7 represents the memory condition. The counter 5 as functions initially not employed, as an output NULL ("ZERO") that is set to HIGH when the counter reading Z is "000", the counter 5 counts up and the clock signal CLK is HIGH at the moment. The counter 5 also has a pre-load input PR and a 3-bit data input for the phase signal (digital word "PHASE") with the pre-load data PR2 (most significant bit MSB) and PR1 as well as PR0. When the pre-load input is HIGH, then the period data are taken as a new counter reading Z and the counter 5 is set in the direction "count up".

Figure 7:
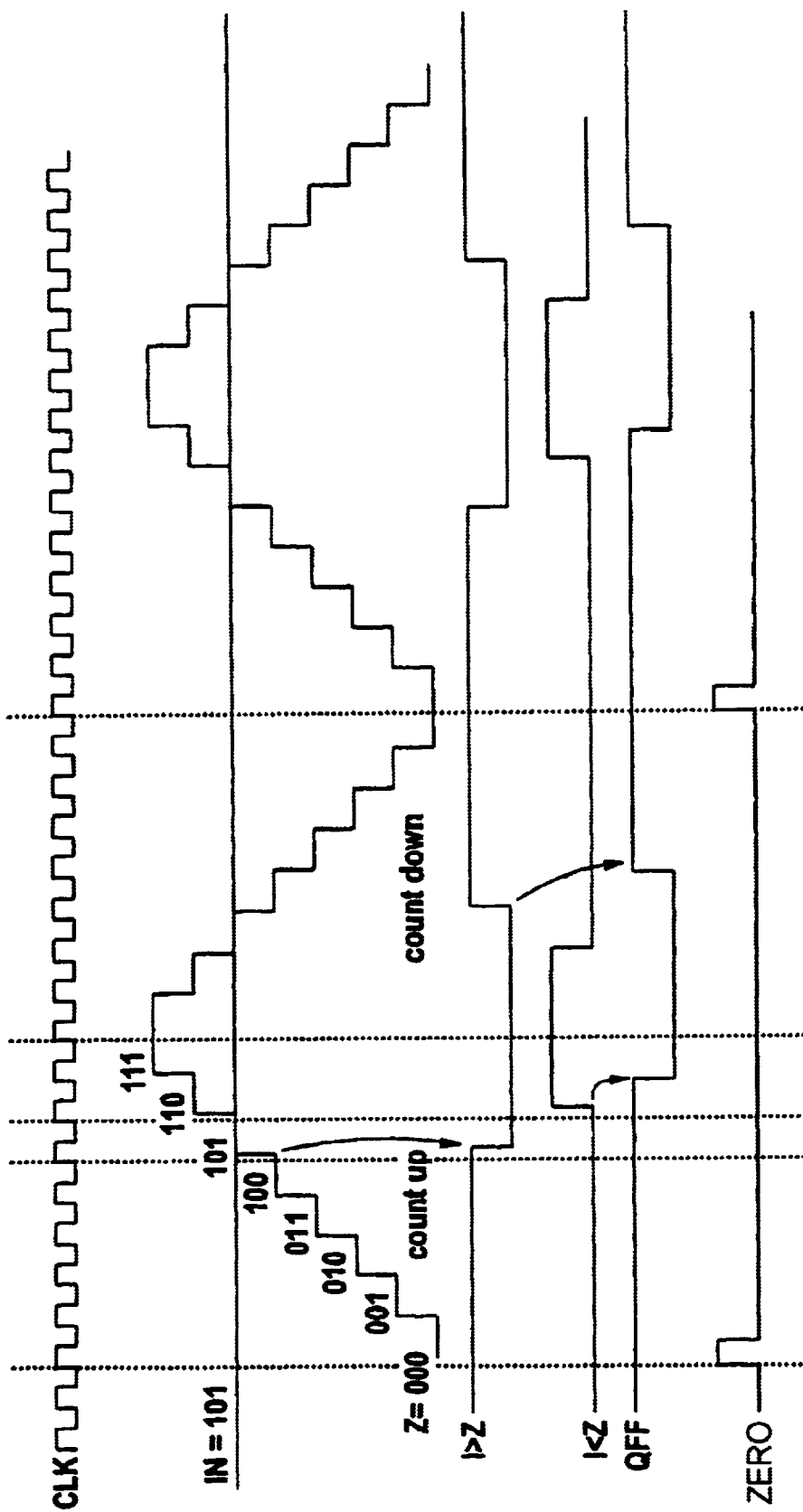
FIG. 7 illustrates the switch behavior of the modulator basic element according to FIG. 6.

With the modulator base element 3 shown in FIG. 6, one obtains the behavior shown in FIG. 7 with reference to the example IN=101. The signals at the outputs I>Z and I<Z of the comparator 6 are simultaneously LOW for a clock period; the condition would thus be I=Z. The flip-flop 7 following the comparator 6 closes this gap by its output being set back and forth by the comparator signals I>Z and I<Z. Further, the flip-flop 7, due to the edge triggering with the clock signal CLK, insures that the brief-duration noise spikes between the clocks have no effect. These noise spikes arise because not all outputs of the counter 5 change absolutely simultaneously from one counter reading to the next and other conditions may arise for the comparator 6 for a brief moment as a result.

The aforementioned, simple pulse width modulation (not shown) can be generated with the modulator base element shown in FIG. 6. The output of the flip-flop 7 corresponds to the drive of the switch element SE1 (output signal S1_MOD); the drive of the switch element SE2 is inverted thereto (inverted output signal S2_MOD). When the output QFF of the flip-flop 7 is at HIGH, then not only the switch element SE1 but also the switch element SE4 is closed (activated) in the switched output stage E. When the output QFF LOW is set, then the switch element SE2 as well as the switch element SE3 of the switched output stage E are activated (closed).

As explained in the description of FIG. 2e, the pulse widths generated by the switch elements SE2 and SE3 behave inversely proportional to the pulse widths generated by the switch elements SE1 and SE4 dependent on the input signal IN. When, given maximum input signal IN, the switch elements SE1 and SE4 are constantly closed, then the switch elements SE2 and SE3 should be constantly opened. When the input signal IN is in the middle of its value range, then the switch elements SE1 and SE4 should not be simultaneously closed but the switch elements SE1 and SE3 should.

Likewise, the switch elements SE2 and SE4 should be simultaneously closed. The drive of the switch element SE4 thus corresponds to the drive of the switch element SE1; however, it is offset by half an output stage switch clock. The same is true of the switch elements SE2 and SE3.

This switch behavior can be achieved by modifying the simple modulator base element 3 according to FIG. 6, by inverting either the counter reading Z or the input signal IN. Since the counter 5 works with the highest clock rate, it is more advantageous—as shown in FIG. 8—to invert the input signal IN to form the word N_IN (inverted input signal).

Figure 8:
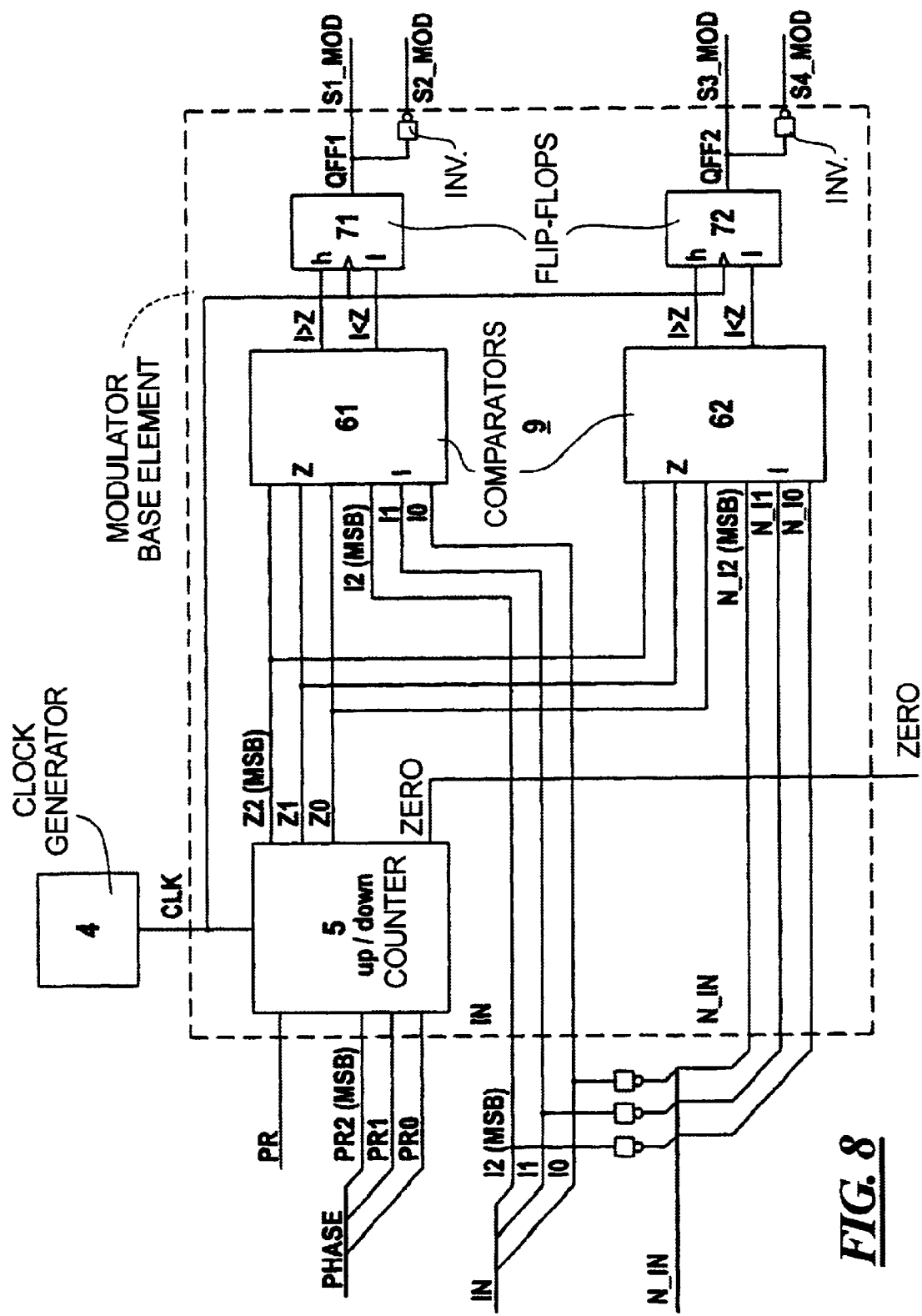
FIG. 8 shows a further modulator basic element that is modified compared to the modulator basic element according to FIG. 6.

The modulator base element 9 shown in FIG. 8—just like the modulator base element 3 according to FIG. 6—has a clock generator 4 and a counter 5. The counter 5 is linked by circuitry to a first comparator 61 and the latter is linked to a first flip-flop 71. The structure and the functioning of the clock generator 7, the counter 5 as well as the comparator 61 and the flip-flop 71 correspond to the structure and the functioning of the modulator base element 3 in FIG. 6. Compared to the modulator base element 3, the modulator base element 9 is expanded by a second comparator and a second flip-flop 72. The inverted input signal N_IN is supplied to the second comparator 62 whose outputs switch the second flip-flop 72 back and forth. The output of the first flip-flop 71 corresponds to the drive of the switch element SE1 (output signal S1_MOD); the drive of the switch element SE2 is inverted thereto (inverted output signal S2_MOD). The output of the second flip-flop 72 corresponds to the drive of the switch element SE3 (output signal S3_MOD). The drive of the switch element SE4 is inverted thereto (inverted output signal S4_MOD). The addition "_MOD" designates a signal as an output signal of the modulator base element 9. Safety times t are still lacking.

Figure 9:
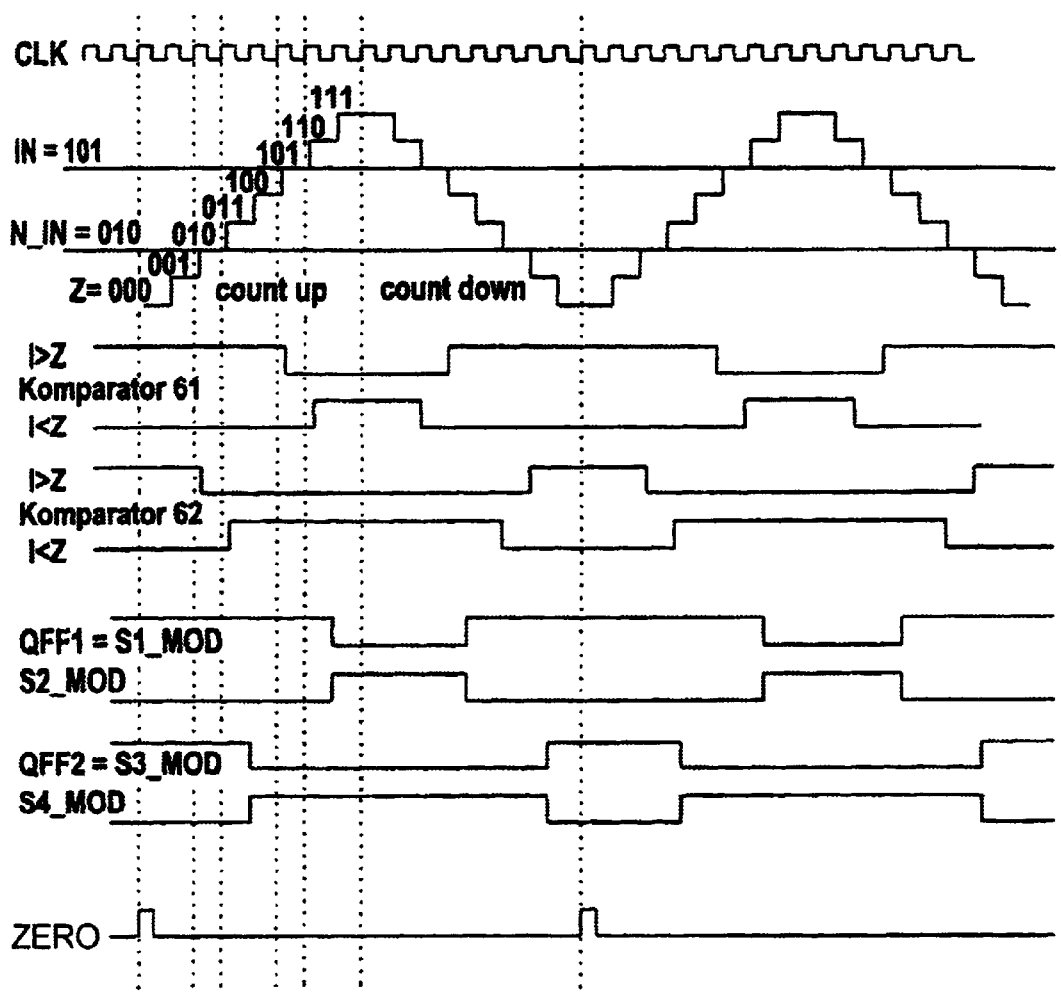
FIG. 9 shows the switch behavior of the modulator basic element according to FIG. 8.

FIG. 9 shows the pulse diagram of the modulator base element 9 according to FIG. 8. The inverted input signal N_IN (value "010") is now also entered into the counter reading Z as a comparator threshold in addition to the input signal IN (value "101"). The signals of the second comparator 62 correspond to the comparison of the counter reading Z to the inverted input signal N_IN. The signals S1_MOD through S4_MOD are the output signals of the modulator base element 9 that are present at the outputs of the first flip-flop 71 and the second flip-flop 72, respectively.

For protecting each switched output stage E1 through E5, adherence to a safety time $t_s$ is generally necessary in the drive. To that end, the drive for switching on each switch element SE1 through SE4 is delayed at all switched output stages E1 through E5, but the drive for turn-off is not delayed.

Figure 10:
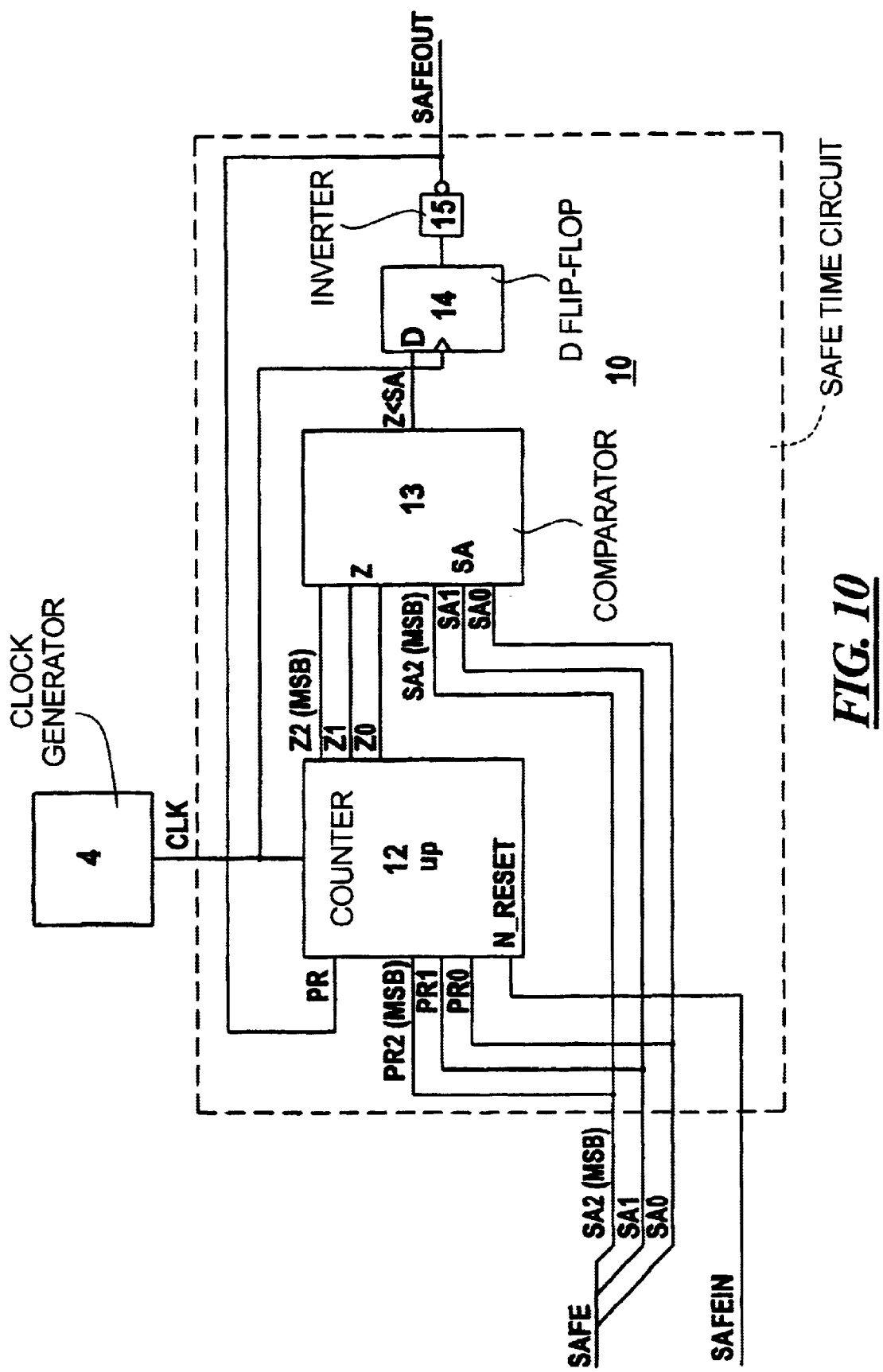
FIG. 10 is a circuit for generating a security time in the drive of a switched output stage in accordance with the invention.

FIG. 10 shows a circuit 10 (again only three bits wide as an example) for generating the safety time $t_s$. The safety time circuit 10 just as the modulator base elements 9 and 3 is supplied with a clock signal CLK from the clock generator 4. The safety time $t_s$ is prescribed by setting the work "SAFE" that is composed of the three bits "PR2" "MSB", "PR1" and "PR0". A counter 12 is arranged in the safety time circuit 10, this counter 12 having a preset input PR that, given HIGH level, accepts the data from PR2 through PR0 as counter reading Z2 through Z0. Further, the counter 12 has a reset input N_RESET that, given LOW level ("therefore the designation N_") sets the counter 12 to the reading "000" regardless of what level is present at the other inputs of the counter 12. The counter 12 works with a clock CLK that is made available by a clock generator 4. The values "Z2", "Z1" and "Z0" at the output of the counter 12 are supplied to a comparator 13 and compared to the values "SA2" "MSB" "SA1" and "SA0" of the word "SAFE" that are likewise supplied to the comparator 13. As long as the counter reading Z is smaller than SAFE (Z <S), a HIGH level appears at the output of the comparator 13. When the counter reading Z reaches the SAFE value that has been set (Z=S), then the output of the comparator 13 is set to LOW. The output of the comparator 13 is distortion-corrected by a D-flip-flop that follows it and that is edge-triggered by the clock signal CLK, and the LOW level of the output of the comparator 13 appears at the output of the D-flip-flop 14 given the next positive signal edge. The D-flip-flop output is then inverted by an inverter 15, so that a HIGH level is now available, thereby retaining the counter 12 in the status "PRESET" as well as making it available as SAFEOUT at the output of the safe time circuit 10.

Figure 11:
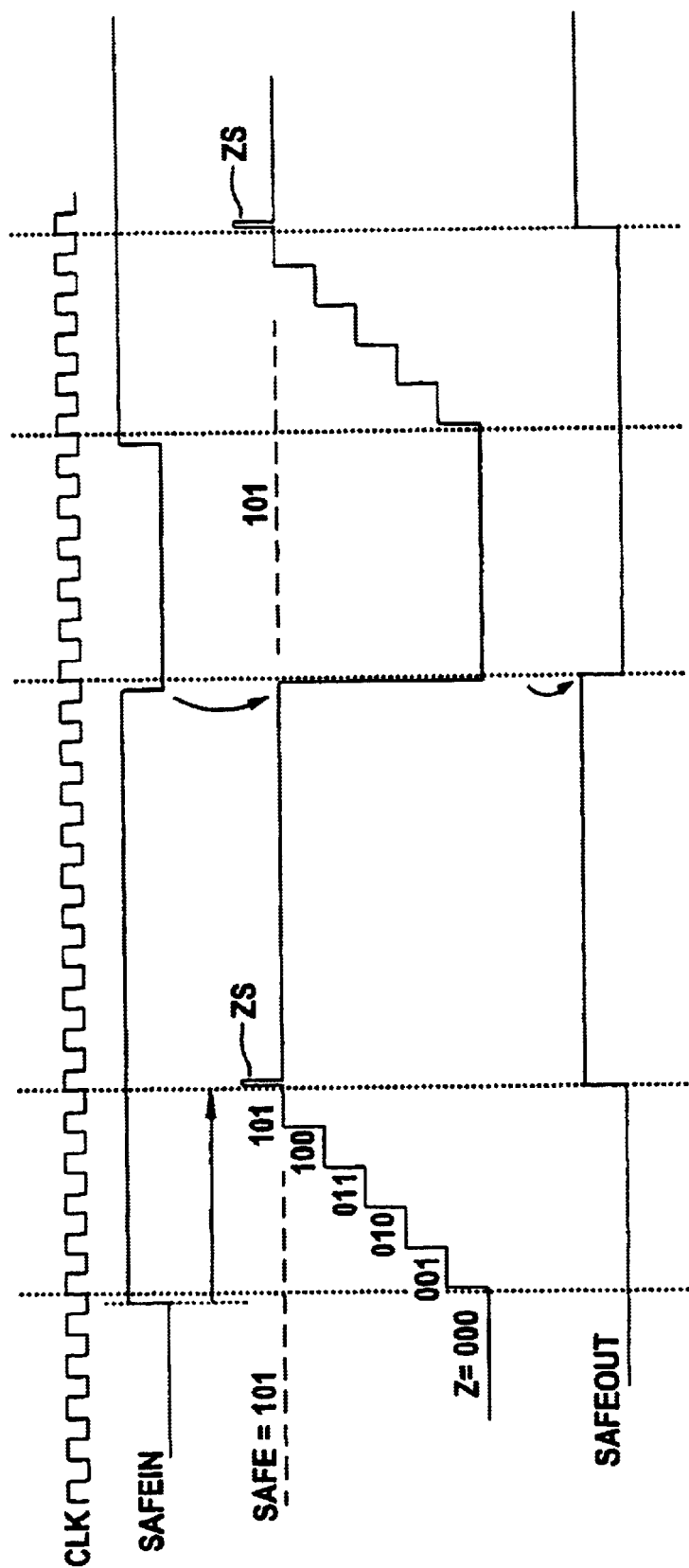
FIG. 11 shows the switch behavior of the security time circuit according to FIG. 10.

FIG. 11 shows the switch behavior of the safe time circuit 10 shown in FIG. 10. The signal SAFEIN is LOW and thus holds the counter 12 in the condition N_RESET to counter reading Z=000. The inequality Z <SA thus applies (see comparator 13 in FIG. 10), and thus the signal SAFEOUT is set to LOW level by the inverter 15. The signal SAFEIN changes to HIGH; the counter 12 can thus count from the next clock edge. When the counter reading Z reaches the value of SAFE, then Z <SA becomes LOW, and the output SAFEOUT of the safe time circuit 10 becomes HIGH at the next clock signal. The counter 12 that has already counted farther by an additional counting step ZS at this edge, remains at the value of SAFE until it is again reset to the value "000" by a LOW level at SAFE. The additional counting step ZS appears when PRESET takes direct effect. When PRESET only takes effect at the edge of clock signal CLK, then the incremented counter reading remains in place for a period of the clock signal CLK and is then reduced to SAFE. The SAFEOUT corresponds to the signal SAFEIN; the change from LOW to HIGH, however, is delayed by "SAFE" clocks. The employment of a counter for setting a safe time $t_s$ is disclosed in German Patent 197 09 768, the disclosure of which is incorporated herein y reference.

In the exemplary embodiment shown in FIGS. 10 and 11, the modulator base element 9 and the safe time circuit 10 are supplied with the same clock, so that there are no problems in view of the signal resolution.

Further control signals are needed for the operation of the digital pulse width modulator DPWM shown in FIG. 5, these either completely blocking the modulator outputs or only blocking two modulator outputs (for switching the switch elements SE1 through SE4 dependent on the current direction) or switching a free-running circuit (upper or lower freewheeling mode, for shutting off the current without count-voltage) by activating (closing) either the switch elements SE1 and SE3 or the switch elements SE2 and SE4.

Figure 12:
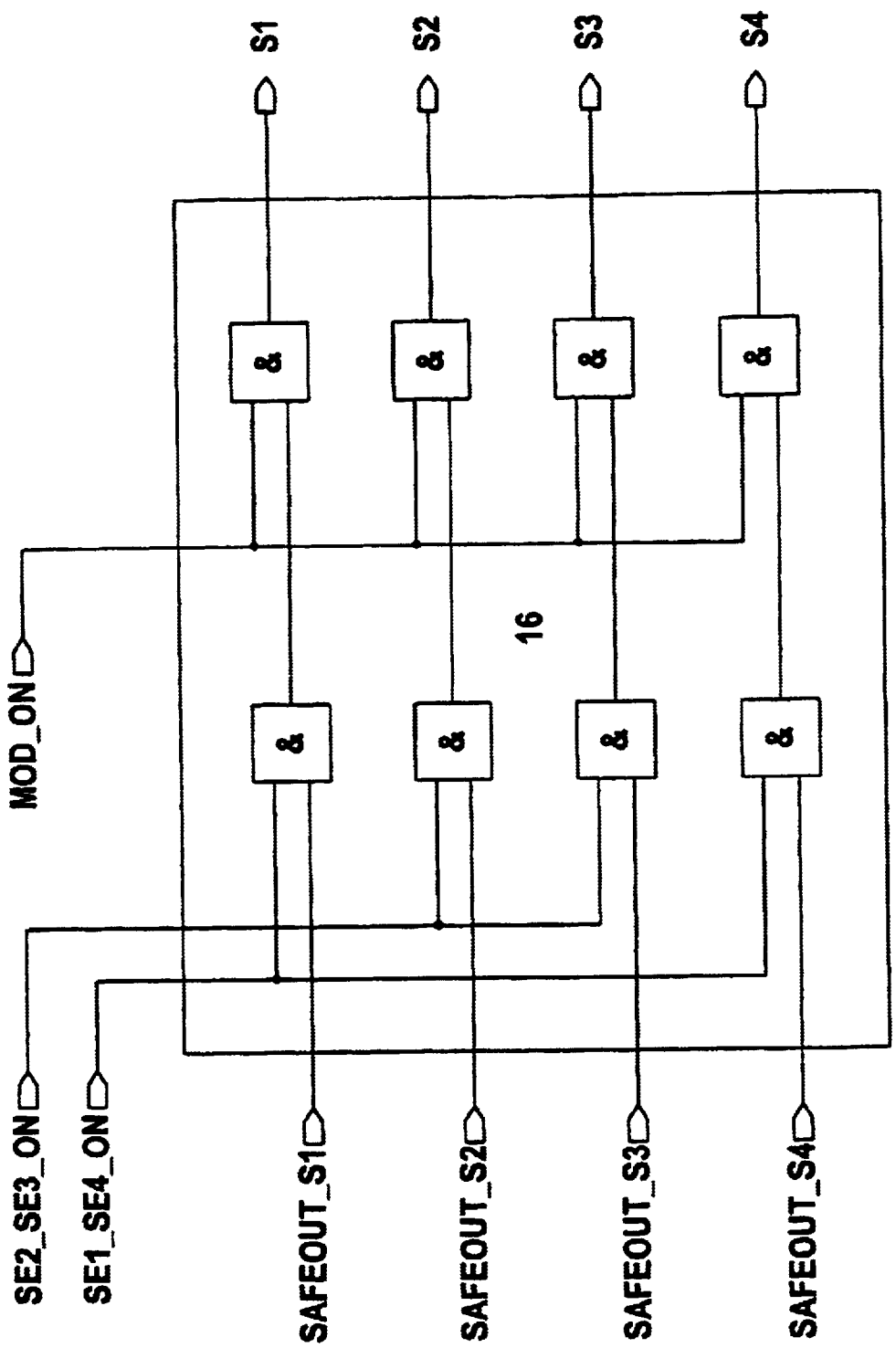
FIGS. 12 through 14 show logical circuit elements of the inventive pulse width modulator.

A modulator block 16 is therefore arranged following the safe time circuit 10 at the outputs of the modulator base element 9. The input signals of the modulator block 16 are SAFEOUT_S1 through SAFEOUT2_S4 according to FIG. 12. The output signals of the modulator block 16 are the pulse-width-modulator control signals S1 through S4 (output signals of the digital pulse width modulator DPWM for driving the switch elements SE1 through SE4 of the switched output stage E). The modulator block 16 is controlled by the signal MOD_ON, with all outputs of the modulator block 16 being inhibited by a LOW level of this signal. Further, the modulator block 16 is controlled by the signals SE2_SE4_ON as well as SE1_SE4_ON. In this case, a LOW level simultaneously blocks the appertaining outputs for the pulse-width-modulated control signals S2 and S3 or S1 and S4.

By identifying the direction of current, a determination can be made as to which switch elements SE1 through SE4 of the switched output stage E (see FIG. 1) carry no current. In the example of FIGS. 2a through 2d, these are the switch elements SE2 and SE3, so that these switch elements could be blocked by a LOW level at the input SE2_SE3_ON of the modulator block 16 without degrading the function of the digital pulse width modulator DPWM.

Figure 13:
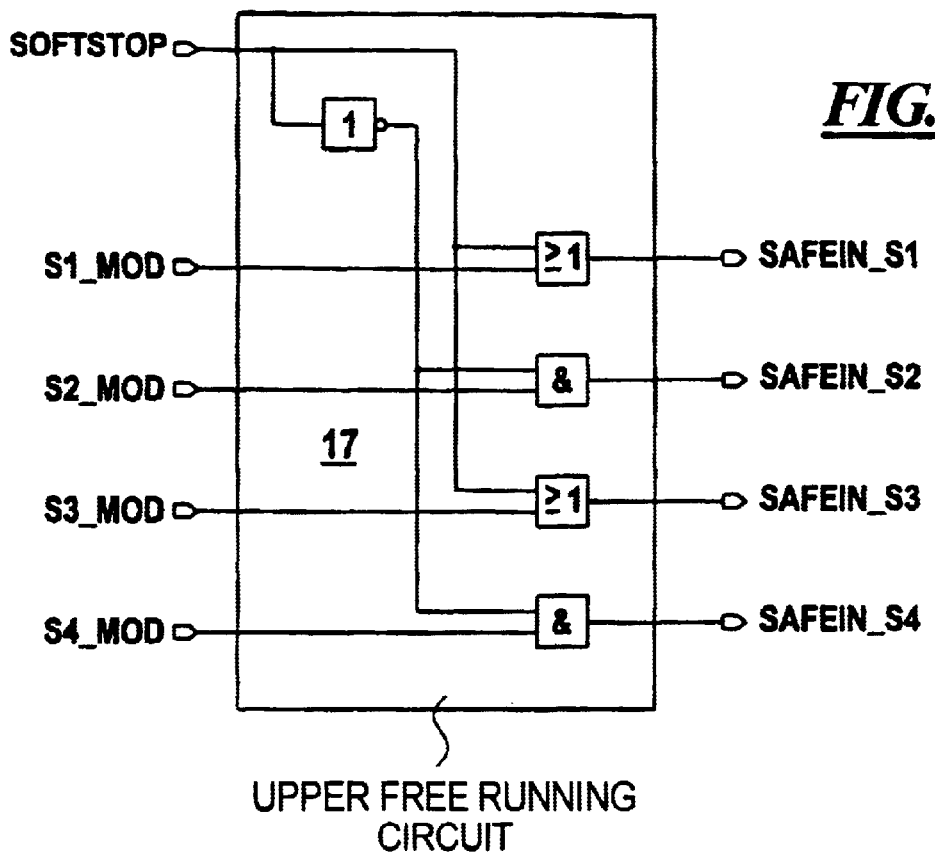
Figure 14:
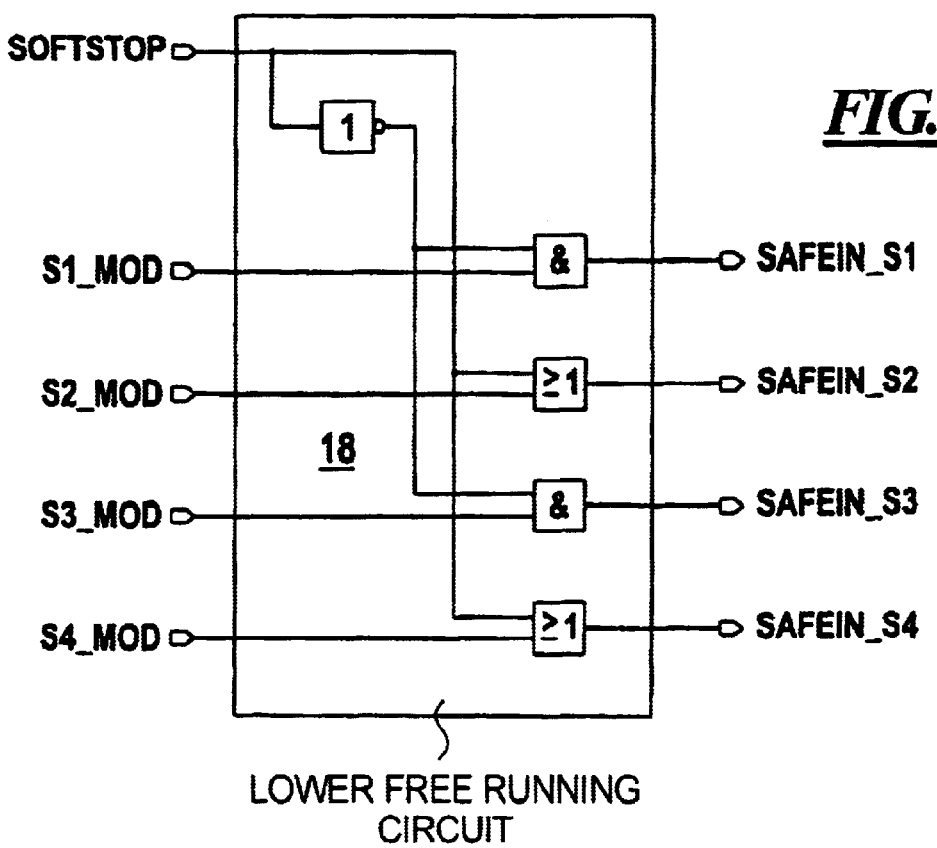

A switch is made to a free-running circuit for shutting off the voltage. Since the digital pulse width modulator DPWM was operating before the voltage shutoff and, for switching into the upper or lower free-running circuit (free-running mode), one switch element may possibly have to be inhibited but another switch may possibly have to be activated, the safe time t, must be taken into consideration during the switching event. An upper free-running circuit 17 (FIG. 13), or a lower free-running circuit 18 (FIG. 14) is therefore arranged in the safe time circuit 10.

The input signals of the free-running circuits 17 and 18 are referenced S1_MOD through S4_MOD, and the output signals are referenced SAFEIN_S1 through SAFEIN_S4. The control signal is identified as SOFTSTOP. When the shut off signal SOFTSTOP is at LOW level, then the signals SAFEIN_Sx correspond to the signals Sx_MOD (x=1, 2, 3, 4). When the shut off signal SAFTSTOP, however, is at HIGH level, then the output signals SAFEIN_S1 and SAFEIN_S3 are activated at the free-running circuit 17 (version of upper free-running circuit, FIG. 13) and the output signals SAFEIN_S2 and SAFEIN_S4 are shut off. The behavior is reversed given the free-running circuit 18 (version with lower free-running circuit, FIG. 14), which can be employed as an equivalent alternative.

Figure 15:
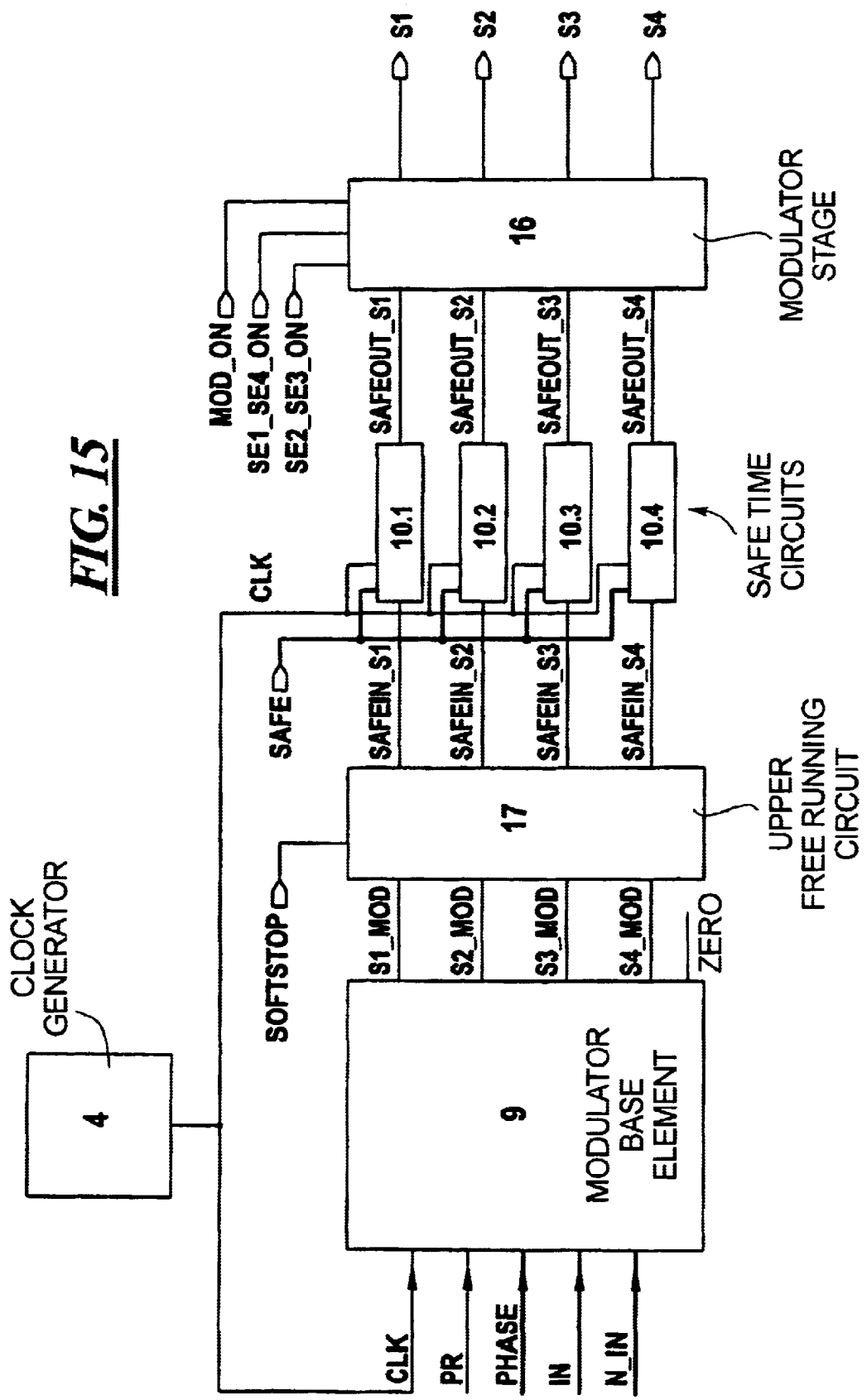
FIG. 15 is a circuit diagram of an embodiment of the inventive pulse width modulator.

FIG. 15 shows a digital pulse width modulator for a switched output stage E. The digital pulse width modulator DPWM is composed of a modulator base element 9, the clock generator 4, free-running circuit 17 (alternatively thereto, free-running circuit 18), four safe time circuits 10.1 through 10.4 and a modulator block 16. In a preferred embodiment of the inventive, digital pulse width modulator DPWM, the input signals IN and the inverted input signals N_IN as well as the counter reading Z exhibit a word width of at least 10 bits. The signal word for the safe time $t_s$ amounts to approximately 7 bits.

In order to drive a series circuit of k output stages (see FIG. 4) with an identical phase offset, the circuit of a digital pulse width modulator shown in FIG. 15 must be constructed k-times. This is explained in FIG. 16 with reference to the example of a series circuit of five output stages E1 through E5.

Figure 16:
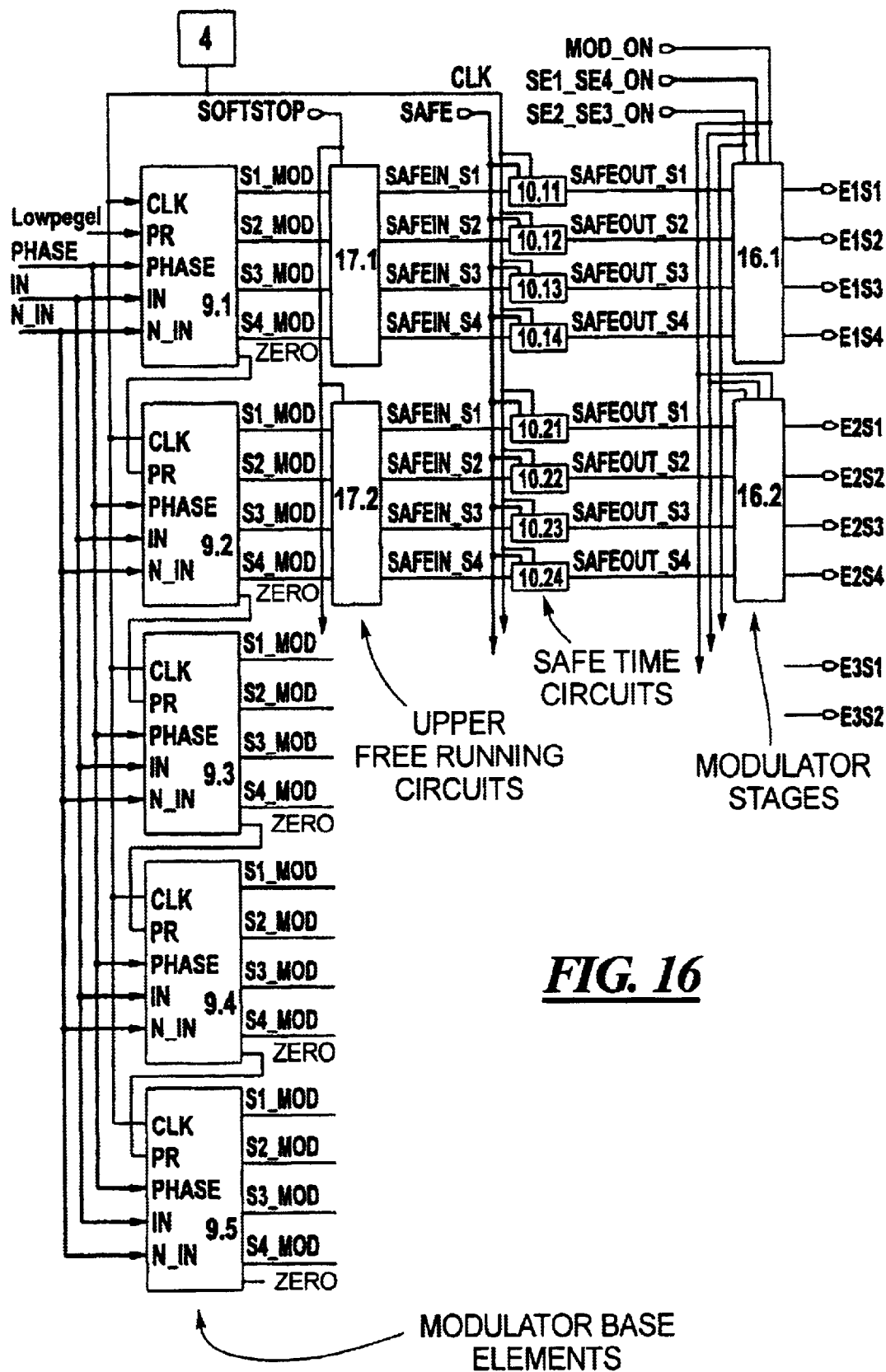
FIG. 16 shows the digital pulse width modulator according to FIG. 15 for a power amplifier according to FIG. 4.

The counter of the first modulator base element 9.1 is free-running. The PRESET input PR of the modulator base element 9.1 is at LOW level; the PRESET inputs PR of the following modulator base elements 9.2 through 9.5, as shown in FIG. 16, are respectively connected to the output NULL ("ZERO") of the preceding modulator base element. The input signals PHASE and SAFE as well as the clock signal CLK are the same for all modulator base elements 9.1 through 9.5 The input signal IN and the inverted input signal N_IN for all modulator base elements 9.1 through 9.5 can likewise be the same (but need not be the same).

The phase offset of the counters (referenced 5 given the modulator base element 9 in FIG. 8) is set by the input signal PHASE. When the counter of the first modulator base element 9.1 generates the signal NULL ("ZERO"), the counter of the second modulator base element 9.2 is set to the counter reading PHASE and "count up". When the counter of the second modulator base element 9.2 generates the signal NULL ("ZERO"), then it sets the counter of the third modulator base element 9.3 to the counter read PHASE and "count up". This is continued until the counters of all modulator base elements 9.1 through 9.5 are aligned in phase relation. This is the case after one pass. A readjustment is required only in case of error, since the counters of all modulator base elements 9.2 through 9.5 are of an identical nature and run with the same clock. When the bit width of the counters amounts to n, then the signal (word) is PHASE= $2^{(n+1)}/k$.

When the inductive load L is a gradient coil, i.e. the power amplifier is implemented as a gradient amplifier, the channels X, Y and Z are required. The circuit shown in FIG. 16 is thus needed three times, but the modulator base elements of the two further circuits can manage without their own counters, since the counters of a cascade of modulator base elements can advantageously continue to be employed. Likewise, the clock signal CLK and the word SAFE is the same.

The input signals IN and the inverted input signals N_IN (see modulator base element 9 in FIG. 8) are a criterion for the pulse width. In case of a digital default, a "synchronization" of the data is necessary, so that a data change does not arbitrarily occur during a signal edge. The synchronization can occur by transferring the data into an input memory. The input memory is written when the input data are stable and a suitable clock edge is present.

An analog pulse width default is converted by A/D converters into the digital words IN, or N_IN, and is employed as an input signal or inverted input signal. So that the input data are stable, it is advantageous when the converter clock of the A/D converter is derived from the clock of the digital pulse width modulator DPWM via a frequency divider and when the data of the A/D converter are written into the input memory with a clock edge.

Figure 17:
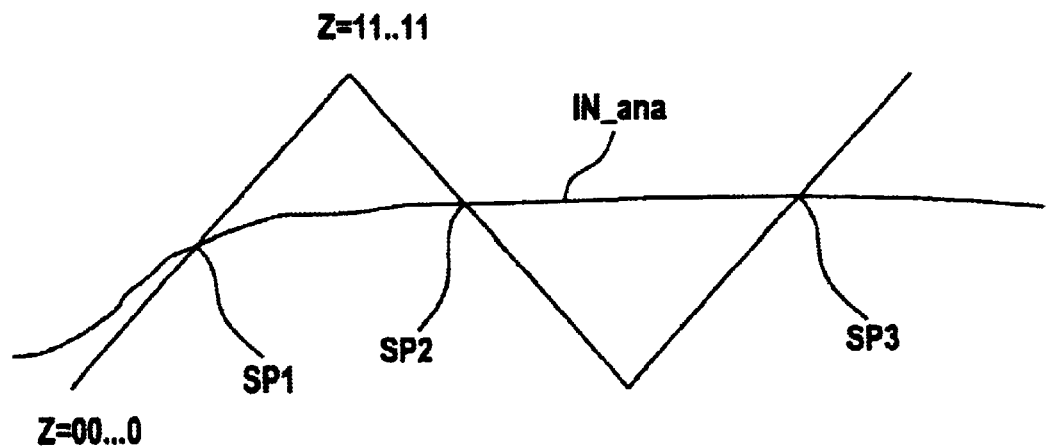
FIG. 17 illustrates the counter reading of the modulator basic element.

One A/D converter fundamentally suffices, which generates the digital input signal IN for the pulse width modulator DPWM from an analog signal. The inverted digital input signal N_IN for the pulse width modulator DPWM is acquired from the digital input signal IN by inversion (see FIG. 8). Alternative, however, two A/D converters can be provided, namely one for the digital input signal IN, the second for the inverted digital input signal N_IN. The precondition therefor, however, is that a second analog signal that is inverted by comparison to the first analog signal is available, from which the digital, inverted signal N_IN can then be acquired. In FIG. 17, the counter reading Z of the modulator base element 3 or 9 (see FIG. 6 and FIG. 8) is a non-digitized (i.e. analog) input signal IN_ana. This non-digitized input signal IN_ana has the indicated intersections SP1 through SP3 with the counter reading Z. Changes of the switch status of the switched output stage E occur at these intersections SP1 through SP3.

Figure 18:
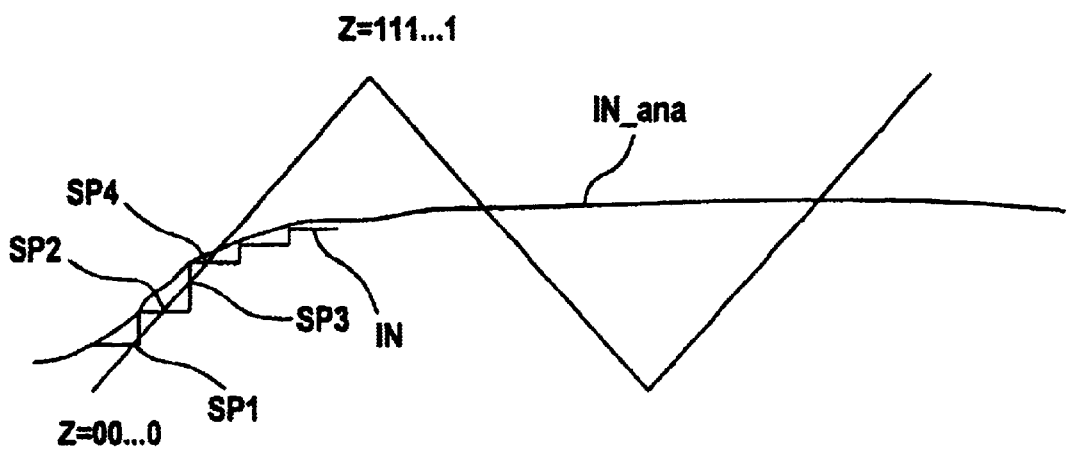

The digital input signal IN that arises from the time-stepping of the non-digitized input signal IN_ana by the limited sampling frequency of the A/D converter is additionally shown in FIG. 18. One can see that many intersections (only the intersections SP1 through SP4 are entered in FIG. 18) can derive in sequence, all of these modifying the switch status of the switched output stage E. The switched output stage E thus is switched with an extremely high clock frequency.

Figure 19:
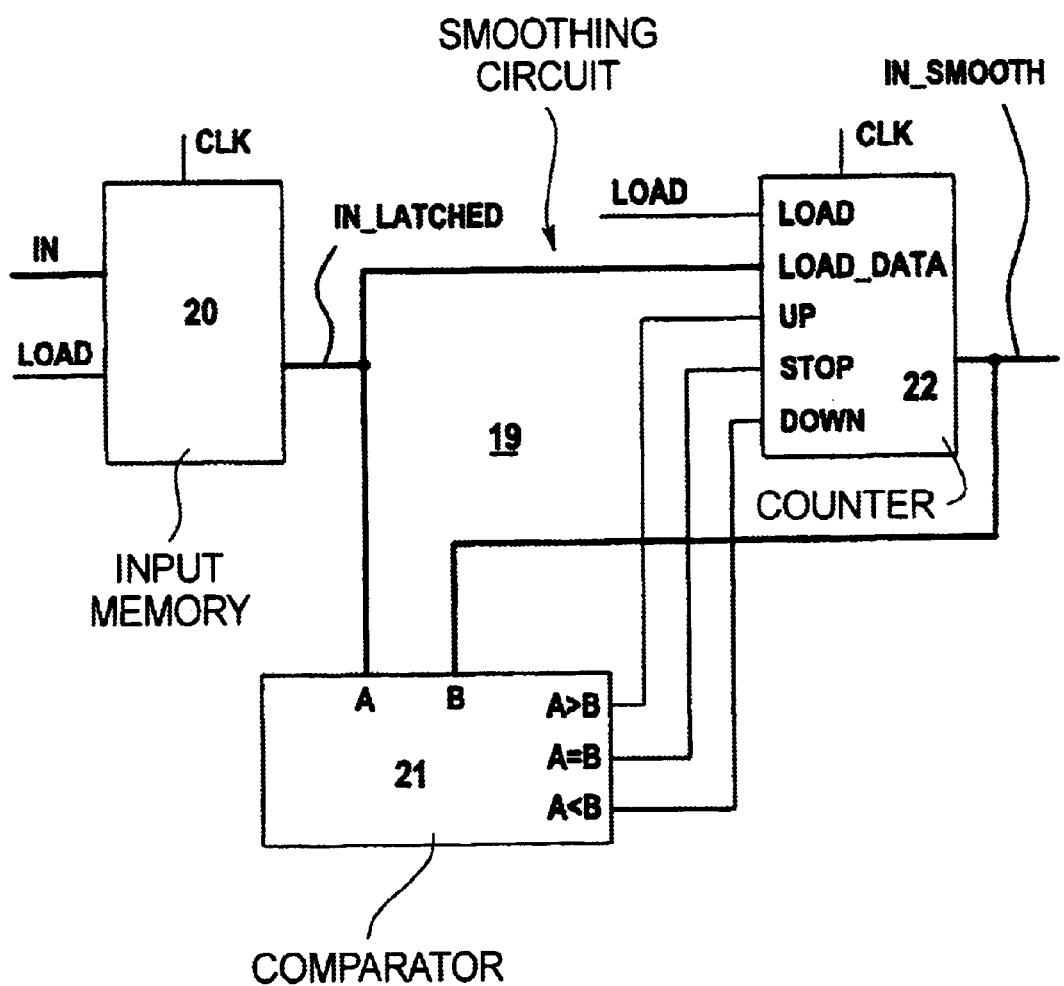

In order to eliminate this disadvantage, the smoothing circuit 19 shown as an option in FIG. 19 can be employed. The smoothing circuit 19 has an input memory 20, a comparator 21 as well as a counter 22 and a frequency divider (not shown) that makes the converter clock CLK-W and the "LOAD" pulse synchronous with the converter clock available from CLK. The comparator 21 has two inputs A and B as well as three outputs A>B, A=B and A<B. The counter 22 has six inputs, CLK, LOAD, LOAD_DATA, UP, STOP and DOWN as well as one output. The functioning of the smoothing circuit 19 is described below with reference to the digital input signal IN. These comments apply analogously to the inverted digital input signal N_IN.

The input signal IN as well as the load pulse LOAD are supplied to the input memory 20. When the load pulse LOAD is at "HIGH", then the input memory 20 stores the data IN at the (positive) edge of CLK. The stored data are referenced below as IN_LATCHED. If these data were supplied to the comparator 6 of the modulator base element 3, then discontinuities shown in FIG. 18 could arise. The data IN_LATCHED are therefore supplied via a first data input A to the comparator 21 of the smoothing circuit 19. The signals IN_LATCHED are also forwarded onto the input LOAD_DATA of the counter 22. The counter reading of the counter 22 is supplied to the second data input B of the comparator 21. The counter 22 and the input memory 20 have the same word length (bit width). The counter 22 in the illustrated exemplary embodiment is supplied by the clock signal CLK of the modulator base element 3 (see, for example, FIG. 6). Alternatively, the counter 22 can be supplied by a synchronous, lower clock of its own clock generator.

When the counter reading IN_SMOOTH of the counter 22 is smaller than the word IN_LATCHED, then the counter 22 is controlled to count up (via the output A<B of the comparator 21, a signal is supplied onto the input UP of the counter 22). When the counter reading is higher than IN_LATCHED, then the counter 22 is controlled to count down (a signal is forwarded onto the input DOWN of the counter 22 via the output A>B of the comparator 21). When the data at the data inputs A and B are identical, then the counter 22 is stopped (a signal is forwarded to the input STOP of the counter 22 via the output A=B of the comparator 21). The output signals IN_SMOOTH of the counter 22 are supplied to the comparator 6 of the modulator base element 3 (see, for example, FIG. 6) instead of the previous input signals IN. Data discontinuities are thus avoided in the input signal IN. When, however, the input signal IN changes faster than the counter 22 can count on the basis of the CLK signal, then this fast change can be processed with an additional measure. To this end, the previous data IN_LATCHED are transferred onto the output IN_SMOOTH at the CLK edge by the LOAD pulse. At the same time, the data IN are transferred into the input memory 20. They form the new data IN_LATCHED.

Although a discontinuity thus occurs again in the input data, a fast reaction of the digital pulse width modulator DPWM is assured in exchange.

The switching frequency of the digital pulse width modulator DPWM is prescribed by the clock signal CLK of the clock generator 4 in the modulator base element 3 or 9 as well as by the bit width of the counters 5 or 12 respectively in the modulator base elements 3 and 9. A synchronization of the switching frequency to a specific frequency is possible by modifying the CLK signal. The clock generator 4 must then be fashioned as a controllable oscillator.

With a given bit width n of the counters of the modulator base element 9, $2^{(n+1)}$ clocks are needed for a "COUNT UP" — "COUNT DOWN" period. The required clock frequency thus amounts to $2^{(n+1)}$ times the switching frequency of an individual switched output stage. Together with the bit width of the counters, the bit width of the input signal IN is also fixed. Given a bit width n, $2^n$ different statuses of the input signal IN are possible and, thus, just as many statuses of the pulse width modulation are possible.

The resolution of the output voltage $U_A$ thus amounts to Upst/$2^n$, whereby Upst references the supply voltage.

The versions and developments of the inventive power amplifier set forth above can be differently combined in further alternative embodiments in order to obtain further versions. At the moment, a power amplifier having an odd-number of switched output stages and an offset of 360° divided by the number of switched output stages in conjunction with a digital pulse width modulator is considered to be the best mode for implementing the invention. The gradient amplifier (cascade amplifier) for the gradient coils of a nuclear magnetic resonance tomography apparatus is driven, according to the invention, by a digital pulse width modulator.

The exemplary embodiments of the inventive power amplifier explained on the basis of FIGS. 1 through 19 show how a digital pulse width modulator can be fundamentally constructed, however, far more versions of this are possible. When the digital pulse width modulator is designed for highest clock frequencies, it can be advantageous when the signal "NULL" ("ZERO") is not linked with the signal CLK but arises only by an operation of the counter reading "000" with the signal "COUNT UP", whereby the signal should be smoothed via a flip-flop triggered by the CLK signal. Two clocks must be subtracted from the signal PHASE in this case.

Fundamentally, any arbitrary counter reading can be used for phase setting, i.e. when the counter stands as "111 . . . 11" as well. The word PHASE must merely be correspondingly adapted. The up-down counter with n bit width can be a n+1 bit wide up counter (flips from "111 . . . 11" to "000 . . . 00") whose MSB (most significant bit) is operated with all other bits via an exclusive-OR circuit. An n-bit up-down behavior can thus be easily realized. Instead of ensuing via a PRESET with a word PHASE, the phase setting can alternatively ensue via a RESET that is triggered when the counters reach a value defining the phase relation. Of course, all levels can also be inverted. In this case, a switch element of the switched output stage is on when the output of the digital pulse width modulator DPWM lies at HIGH.

It is also fundamentally conceivable to interchange the effects of PRESET and RESET at the safe time $t_s$.

The embodiments of the inventive power amplifier shown in FIGS. 1 through 18 are based on the fundamental principle that one counter signal is necessary for pulse width modulation, this modifying its value up and down, and that this counter signal is compared to an input signal or to two input signals. The counter readings are phase-shifted for cascading. An intervention into the pulse width modulation for voltage shut off (freewheeling circuit) must ensue before generation of the safe times $t_s$. The safe times $t_s$ are preferably generated with a counter circuit whose clock signal CLK is the modulator clock.

The shut off of individual or of all outputs of the digital pulse width modulator DPWM preferably ensues directly at the outputs. A synchronization of the switching frequency is possible with modifying the clock signal CLK.

Although modifications and changes may be suggested by those skilled in the art, it is the intention of the inventors to embody within the patent warranted hereon all changes and modifications as reasonably and properly come within the scope of their contribution to the art.

We claim as our invention:

1. A power amplifier comprising:

a switched output stage containing a power bridge circuit formed by a plurality of switch elements and connected to a floating intermediate circuit voltage;

a digital pulse width modulator, connected to said switch elements, which generates pulse width modulated control signals for the respective switch elements from digital signals, thereby causing said switched output stage to generate an output stage voltage dependent on an output stage switching clock; and said digital pulse width modulator comprising a counter having an output at which a counter reading is present, and a comparator having a first input for receiving said counter reading, a second input for receiving at least one of said digital input signals, a first output for emitting a binary signal if said counter reading is less than said one of said digital input signals, a second output for a binary signal if said counter reading is greater than said one of said digital input signals, and a control signal generator connected to aid first and second outputs of said comparator for generating said control signals for said switch elements dependent on the respective binary signals at said first and second outputs of said comparator.

2. A power amplifier as claimed in claim 1 wherein said control signal generator includes at least one flip-flop which is operated by said respective binary signals at said first and second outputs.

3. A power amplifier as claimed in claim 1 wherein said control signal generator contains an inverter for inverting at least one of the respective binary signals at said first and second outputs of said comparator.

4. A power amplifier as claimed in claim 1 wherein said power bridge circuit is an H-bridge containing 4 switch elements, and wherein said comparator is a first comparator and wherein said digital pulse width modulator comprises a second comparator, identical to said first comparator, and wherein said control signal generator is a first control signal generator and is connected to said first and second outputs of: said first comparator, and said digital pulse width modulator comprising a second control signal generator, identical to said first control signal generator, connected to the first and second outputs of said second comparator, and wherein said first control signal generator generates control signals for two of said switch elements and wherein said second control signal generator generates control signals for a different two of said switch elements.

5. A power amplifier as claimed in claim 1 wherein said digital pulse width modulator comprises a smoothing circuit, preceding said comparator, said smoothing circuit being supplied with said at least one of said input signals and having a smoothing circuit comparator and an up/down counter which operate on said one of said input signals to smooth said one of said input signals.

6. A power amplifier as claimed in claim 5 wherein said up/down counter comprises an input allowing data to be directly transmitted to said comparator.

7. A power amplifier as claimed in claim 1 wherein said digital pulse width modulator comprises a free-running circuit connected following said control signal generator.

8. A power amplifier as claimed in claim 1 wherein said digital pulse width modulator comprises a plurality of safety circuits, respectively for each of said switch elements for preventing simultaneous switching on of any two of said switch elements.

9. A power amplifier as claimed in claim 8 wherein each safety circuit comprises a counter which delays a switching time for the switch element connected thereto, following receipt of a control signal from the control signal generator for that switch element, by a predetermined number of counting steps.

10. A power amplifier as claimed in claim 9 wherein said digital pulse width modulator comprises a clock generator for supplying clock signals to said counter for setting a size of said counting step.

11. A power amplifier as claimed in claim 1 further comprising a modulator stage, connected following said control signal generator, for selectively controlling forwarding of said control signals from said control signal generator to the respective switch elements.

12. A power amplifier as claimed in claim 1 wherein said digital pulse width modulator comprises a clock generator for supplying a clock signal to said counter for setting a count increment of said counter.

13. A power amplifier as claimed in claim 1 wherein said switched output stage is a first switched output stage and wherein said digital pulse width modulator is a first digital pulse width modulator, and wherein said power amplifier comprises a plurality of additional switched output stages, identical to said first switched output stage, and a plurality of additional digital pulse width modulators, identical to said first digital pulse width modulator, respectively connected to said plurality of additional switched output stages, and further comprising a single clock generator, connected to said first digital pulse width modulator and said plurality of additional digital pulse width modulators, for supplying a clock signal to each counter in each digital pulse width modulator for operating the respective counters.

14. A power amplifier as claimed in claim 1 further comprising an analog-to-digital converter for generating said at least one of said digital input signals, said analog-to-digital converter being operable with a clock signal, and wherein said digital pulse width modulator comprises a clock signal generator for generating said clock signal for said analog-to-digital converter.

15. A power amplifier as claimed in claim 1 wherein said switched output stage is a first switched output stage and comprising at least one further switched output stage identical to said first switched output stage, and wherein said digital pulse width modulator is a first digital pulse width modulator and wherein said power amplifier comprises at least one further digital pulse width modulator identical to said first digital pulse width modulator and connected to said at least one further switched output stage, said first switched output stage and said at least one further switched output stage generating respective output stage voltages, and said first switched output stage and said at least one further switched output stage being connected in series for adding said respective output stage voltages to produce a total output voltage.

16. A power amplifier as claimed in claim 15 wherein said first switched output stage and said plurality of further switched output stages, in total, comprise an odd number of switched output stages.

17. A power amplifier as claimed in claim 14 wherein said first switched output stage and said at least one further switched output stage respectively contribute substantially equal contributions to said total output voltage.

18. A power amplifier as claimed in claim 14 wherein said first switched output stage and said at least one further switched output stage respectively contribute substantially symmetrical contributions to said total output voltage.

19. A power amplifier as claimed in claim 1 wherein said digital pulse width modulator produces said control signals for operating said bridge circuit in a first diagonal mode, a lower free-running mode, a second diagonal mode and an upper free-running mode in every cycle of said output stage switching clock.

* * * * *